US012587161B2

(12) United States Patent
Gong et al.

(10) Patent No.: US 12,587,161 B2
(45) Date of Patent: Mar. 24, 2026

(54) HIGHER ORDER LAMB WAVE ACOUSTIC DEVICES WITH COMPLEMENTARILY-ORIENTED PIEZOELECTRIC LAYERS

(71) Applicant: THE BOARD OF TRUSTEES OF THE UNIVERSITY OF ILLINOIS, Urbana, IL (US)

(72) Inventors: Songbin Gong, Champaign, IL (US); Yansong Yang, Urbana, IL (US); Ruochen Lu, Champaign, IL (US); Steffen Link, Urbana, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 406 days.

(21) Appl. No.: 17/863,586

(22) Filed: Jul. 13, 2022

(65) Prior Publication Data

US 2023/0039934 A1 Feb. 9, 2023

Related U.S. Application Data

(60) Provisional application No. 63/221,487, filed on Jul. 14, 2021.

(51) Int. Cl.
| | |
|---|---|
| *H03H 9/02* | (2006.01) |
| *H03H 9/13* | (2006.01) |
| *H03H 9/30* | (2006.01) |

(52) U.S. Cl.
CPC .... *H03H 9/02228* (2013.01); *H03H 9/02023* (2013.01); *H03H 9/13* (2013.01); *H03H 9/30* (2013.01)

(58) Field of Classification Search
CPC .. H03H 9/02; H03H 9/17; H03H 9/30; H03H 9/64
See application file for complete search history.

(56) References Cited

U.S. PATENT DOCUMENTS

| | | | | |
|---|---|---|---|---|
| 5,532,538 | A | * | 7/1996 | Jin ..................... H03H 9/02228 310/313 R |
| 6,975,183 | B2 | * | 12/2005 | Aigner ................. H03H 9/0095 29/25.35 |

(Continued)

OTHER PUBLICATIONS

Akiyama et al., "Enhancement of piezoelectric response in scandium aluminum nitride alloy thin films prepared by dual reactive cosputtering", Advanced Materials, vol. 21, No. 5, pp. 593-596, Feb. 2009.

(Continued)

*Primary Examiner* — Andrea Lindgren Baltzell
*Assistant Examiner* — Alan Wong
(74) *Attorney, Agent, or Firm* — Lowenstein Sandler LLP

(57) ABSTRACT

A device includes a stack of at least two piezoelectric layers configured to propagate a Lamb wave in a mode having an order corresponding to a number of piezoelectric layers of the stack. The stack includes a first piezoelectric layer and a second piezoelectric layer disposed on the first piezoelectric layer. The first piezoelectric layer has a first cut plane orientation, and the second piezoelectric layer has a second cut plane orientation complementary to the first cut plane orientation. The device further includes an interdigitated transducer (IDT) disposed on at least a top surface of the stack or a bottom surface of the stack. In some embodiments, the device is an acoustic resonator. In some embodiments, the device is an acoustic delay line.

21 Claims, 24 Drawing Sheets

(56) References Cited

U.S. PATENT DOCUMENTS

| | | | | |
|---|---|---|---|---|
| 9,112,134 | B2 * | 8/2015 | Takahashi | H10N 30/87 |
| 9,148,107 | B2 * | 9/2015 | Ueda | H03H 3/02 |
| 9,172,351 | B2 * | 10/2015 | Khine | H03H 9/54 |
| 9,385,685 | B2 * | 7/2016 | Bhattacharjee | H03H 9/17 |
| 9,634,226 | B2 * | 4/2017 | Takahashi | H03H 9/059 |
| 10,261,078 | B2 * | 4/2019 | Branch | G01N 33/5438 |
| 11,165,406 | B2 * | 11/2021 | Lin | H03H 9/02007 |
| 2021/0384887 | A1 * | 12/2021 | Mortazawi | H03H 9/605 |
| 2024/0250657 | A1 * | 7/2024 | Nagatomo | H03H 9/145 |
| 2024/0413808 | A1 * | 12/2024 | Walenta | H03H 9/174 |
| 2025/0015784 | A1 * | 1/2025 | Nagatomo | H03H 9/173 |

OTHER PUBLICATIONS

Assila et al., "High-frequency resonator using A1 Lamb wave mode in LiTaO3 plate", IEEE Transactions on Ultrasonics, Ferroelectrics, and Frequency Control, vol. 66, No. 9, pp. 1529-1535, Sep. 2019.

Bajak et al., "Attenuation of acoustic waves in lithium niobate", The Journal of the Acoustical Society of America, vol. 69, No. 3, pp. 689-695, Mar. 1981.

Boccardi, R.W. Heath, Jr., A. Lozano, T. L. Marzetta, and P. Popovski, "Five disruptive technology directions for 5G", IEEE Commun. Mag., vol. 52, No. 2, pp. 74-80, Feb. 2014.

Bogner et al., "Impact of high sc content on crystal morphology and RF performance of sputtered Al1-x ScxN SMR BAW", in Proceedings of IEEE International Ultrasonics Symposium (IUS), pp. 706-709, Oct. 2019.

Bousquet et al., "Single-mode high frequency LiNbO3 film bulk acoustic resonator", in Proceedings of IEEE International Ultrasonics Symposium (IUS), pp. 87-87, Oct. 2019.

Cassella, et al., "Aluminum nitride cross-sectional Lamé mode resonators", Journal of Microelectromechical Systems, vol. 25, No. 2, pp. 275-285, Apr. 2016.

Chang et al., "Analysis of methods for determining electromechanical coupling coefficients of piezoelectric elements", IEEE Transactions on Ultrasonics, Ferroelectrics, and Frequency Control, vol. 42, No. 4, pp. 630-640, Jul. 1995.

Chauhan et al., "Enhancing RF bulk acoustic wave devices: Multiphysical modeling and performance", IEEE Microwave Magazine, vol. 20, No. 10, pp. 56-70, Oct. 2019.

Coldren, A., et al. "Surface-acoustic-wave resonator filters", Proc. IEEE, vol. 67, No. 1, pp. 147-158, Jan. 1979.

Colombo et al., "Investigation of 20% scandium-doped aluminum nitride films for MEMS laterally vibrating resonators", in Proceedings of IEEE International Ultrasonics Symposium (IUS), pp. 1-4, Sep. 2017.

Cortes et al., "Dispersion of elastic guided waves in piezoelectric infinite plates with inversion layers", International Journal of Solids and Structures, vol. 45, Nos. 18-19, pp. 5088-5102, Sep. 2008.

Cortes, et al., "Elastic guided wave propagation in a periodic array of multi-layered piezoelectric plates with finite cross-sections", Ultrasonics, vol. 50, No. 3, pp. 347-356, Mar. 2010.

Feld et al., "After 60 years: A new formula for computing quality factor is warranted", in Proceedings of IEEE Ultrasonics Symposium, pp. 431-436, Nov. 2008.

Gong et al., "Design and analysis of lithium-niobate-based high electromechanical coupling RF-MEMS resonators for wideband filtering", IEEE Transactions on Microwave Theory and Techniques, vol. 61, No. 1, pp. 403-414, Jan. 2013.

Hagelauer, G., et al., "Microwave acoustic wave devices: Recent advances on architectures, modeling, materials, and packaging", IEEE Trans. Microw. Theory Techn., vol. 66, No. 10, pp. 4548-4562, Oct. 2018.

Hartmann et al., "Overview of design challenges for single phase unidirectional SAW filters", in Proceedings of IEEE Ultrasonics Symposium, pp. 79-89, Oct. 1989.

IEEE Standard on Piezoelectricity, ANSI/IEEE Standard, vol. 176-1987, 74 pages, 1988.

Jian et al., "A new type SPUDT SAW for use in high frequency around 2 GHZ", in Proceedings of IEEE Ultrasonics Symposium, pp. 279-282, Oct. 2002.

Kaajakari et al., "Nonlinear limits for single-crystal silicon microresonators", Journal of Microelectromechanical Systems, vol. 13, No. 5, pp. 715-724, Oct. 2004.

Kadota et al., "High-frequency Lamb wave device composed of MEMS structure using LiNbO3 thin film and air gap", IEEE Transactions on Ultrasonics, Ferroelectrics, and Frequency Control, vol. 57, No. 11, pp. 2564-2571, Nov. 2010.

Kadota et al., "Suprious-free, Near-Zero-TCF hetero acoustic layer (HAL) Saw resonators using LiTaO3 thin plate on quartz", in Proceedings of IEEE International Ultrasonics Symposium (IUS), 4 pages, Oct. 2018.

Kadota et al., "Ultra-wideband T-and π-type ladder filters using a fundamental shear horizontal mode plate wave in a LiNbO3 plate", Japanese Journal Applied Physics, vol. 58, No. SGGC10, 5 pages, Jul. 2019.

Kadota et al., "Wideband acoustic wave resonators composed of hetero acoustic layer structure", Japanese Journal of Applied Physics, vol. 57, No. 07LD12, pp. 1-4, 2018.

Karasawa et al., "C-axis Zig-Zag polarization inverted ScAlN multilayer for FBAR transformer rectifying antenna", in Proceedings of IEEE International Ultrasonics Symposium (IUS), pp. 1-4, Sep. 2017.

Kimura et al., "Comparative study of acoustic wave devices using thin piezoelectric plates in the 3-5-GHz range", IEEE Transactions on Microwave Theory and Techniques, vol. 67, No. 3, pp. 915-921, Mar. 2019.

Kochhar et al., "Top electrode shaping for harnessing high coupling in thickness shear mode resonators in Y-cut lithium niobate thin films", in Proceedings of IEEE Micro Electro Mechical Systems (MEMS), pp. 71-74, Jan. 2018.

Kuznetsova et al., "Investigation of acoustic waves in thin plates of lithium niobate and lithium tantalate", IEEE Transactions of Ultrasonics, Ferroelectrics, and Frequency Control, vol. 48, No. 1, pp. 322-328, Jan. 2001.

Lakin, K. M., "Electrode resistance effects in interdigital transducers", IEEE Transactions of Microwave Theory and Techniques, vol. 22, No. 4, pp. 418-424, Apr. 1974.

Larson, et al., "Modified Butterworth-Van Dyke circuit for FBAR resonators and automated measurement system", in Proceedings of IEEE Ultrasonics Symposium International Symposium, vol. 1, Oct. 2000, pp. 863-868.

Laughlin et al., "Emerging hardware enablers for more efficient use of the spectrum", in Proceedings of IEEE International Symposium Dyn. Spectr. Access Netw. (DySPAN), pp. 1-9, Nov. 2019.

Lee et al., "Spectrum for 5G: Global status, challenges, and enabling technologies", IEEE Commun. Mag., vol. 56, No. 3, pp. 12-18, Mar. 2018.

Lehtonen, et al., "SPUDT filters for the 2.45 GHz ISM band", IEEE Transactions on Ultrasonics, Ferroelectrics, and Frequency Control, vol. 51, No. 12, pp. 1697-1703, Dec. 2004.

Levy et al., "Fabrication of single-crystal lithium niobate films by crystal ion slicing", Applied Physics Letters, vol. 73, No. 16, pp. 2293-2295, Oct. 1998.

Lu et al., "5-GHz antisymmetric mode acoustic delay lines in lithium niobate thin film", IEEE Transactions on Microwave Theory and Techniques, vol. 68, No. 2, pp. 573-589, Feb. 2020.

Lu et al., "A unidirectional transducer design for scaling GHz AlN-based RF microsystems", IEEE Transactions on Ultrasonics, Ferroelectrics, and Frequency Control, vol. 67, No. 6, pp. 1250-1257, Jun. 2020.

Lu et al., "GHz broadband SHO mode lithium niobate acoustic delay lines", IEEE Transactions on Ultrasonics, Ferroelectrics, and Frequency Control, vol. 67, No. 2, pp. 402-412, Feb. 2020.

Lu et al., "Gigahertz low-loss and wideband S0 mode lithium niobate acoustic delay lines", IEEE Transactions on Ultrasonics, Ferroelectrics, and Frequency Control, vol. 66, No. 8, pp. 1373-1386, Aug. 2019.

(56)                  References Cited

OTHER PUBLICATIONS

Lu et al., "Study of thermal nonlinearity in lithium niobate-based MEMS resonators", in Proceedings of the 18th International Solid-State Sens., Actuators Microsyst. Conference (Transducers), pp. 8-11, Jun. 2015.

Lu et al., "Wideband bandpass filters with SAW-filter-like selectivity using chip SAW resonators", IEEE Transactions on Microwave Theory and Techniques, vol. 62, No. 1, pp. 28-36, Jan. 2014.

Lu, et al., "8.5 GHZ and 11.5 GHz acoustic delay lines using higher-order Lamb modes in lithium niobate thin film", in Proceedings of IEEE 33rd International Conference Micro Electro Mechanical Systems (MEMS), pp. 1242-1245, Jan. 2020.

Lu et al., "Accurate extraction of large electromechanical coupling in piezoelectric MEMS resonators", Journal of Microelectromechanical Systems, vol. 28, No. 2, pp. 209-218, Apr. 2019.

Manzaneque et al., "Lithium niobate MEMS chirp compressors for near zero power wake-up radios", Journal of Microelectromechical Systems, vol. 26, pp. 1204-1215, Sep. 2017.

Manzaneque et al., "Low-loss and wideband acoustic delay lines", IEEE Transactions on Microwave Theory and Techniques, vol. 67, No. 4, pp. 1379-1391, Apr. 2019.

Nakamura et al., "Effect of a ferroelectric inversion layer on the temperature characteristics of SH-type surface acoustic waves on 36○ Y-X LiTaO3 substrates", IEEE Transactions on Ultrasonics, Ferroelectrics, and Frequency Control, vol. 41, No. 6, pp. 872-875, Nov. 1994.

Nakamura et al., "Local domain inversion in ferroelectric crystals and its application to piezoelectric devices", in Proceedings of IEEE Ultrasonics Symposium, pp. 309-318, Oct. 1989.

Nishihara et al., "High performance and miniature thin film bulk acoustic wave filters for 5 GHZ", in Proceedings of IEEE Ultrasonics Symposium, Oct. 2002, pp. 969-972.

Odagawa et al., "10 GHz range extremely low-loss ladder type surface acoustic wave filter", in Proceedings of IEEE Ultrasonics Symposium, Oct. 1998, pp. 103-106.

Park et al., "A 10 GHz single-crystalline scandium-doped aluminum nitride lambwave resonator", in Proceedings of the 20th International Conference Solid-State Sens., Actuators Microsyst. Eurosensors XXXIII (Transducers Eurosensors XXXIII), pp. 450-453, Jun. 2019.

Parkvall, S., et al., "NR: The new 5G radio access technology", IEEE Commun. Standards Mag., vol. 1, No. 4, pp. 24-30, Dec. 2017.

Plessky et al., "5 GHZ laterally-excited bulk-wave resonators (XBARs) based on thin platelets of lithium niobate", Electronics Letters, vol. 55, No. 2, pp. 98-100, Jan. 2019.

Popovski, K. F., et al. "5G wireless network slicing for eMBB, URLLC, and mMTC: A communication theoretic view", IEEE Access, vol. 6, pp. 55765-55779, 2018.

Psychogiuo et al., "Hybrid acoustic-wave-lumped-element resonators (AWLRs) for high-Q bandpass filters with quasi-elliptic frequency response," IEEE Transactions of Microwave Theory and Technique, vol. 63, No. 7, pp. 2233-2244, Jul. 2015.

Rodriguez et al., "Direct detection of Akhiezer damping in a silicon MEMS resonator", Scientific Reports, vol. 9, No. 1, p. 2244, Dec. 2019.

Ruby, R., "A snapshot in time: The future in filters for cell phones", IEEE Microwave Magazine, vol. 16, No. 7, pp. 46-59, Aug. 2015.

Schermer et al., "Millimeter-wave dielectric properties of highly refractive single crystals characterized by waveguide cavity resonance", IEEE Transactions on Microwave Theory and Techniques, vol. 67, No. 3, pp. 1078-1087, Mar. 2019.

Sergovia-Fernandez et al, "Thermal nonlinearities in contour mode AIN resonators", Journal of Microelectromechanical Systems, vol. 22, No. 4, pp. 976-985, Aug. 2013.

Shen et al., "452 MHz bandwidth, high rejection 5.6 GHz UNII XBAW coexistence filters using doped AIN-on-silicon", in IEDM Tech. Dig., pp. 17.6.1-17.6.4, Dec. 2019.

Takai et al., "I.H.P. Saw technology and its application to microacoustic components (Invited)", in Proceedings of IEEE International Ultrasonics Symposium (IUS), 8 pages, Sep. 2017.

Tourlog et al., "SH-type leaky surface waves on rotated Y-cut LiTaO3 substrates with a ferroelectric inversion layer", Japanese Journal of Applied Physics, vol. 30, No. S1, p. 159, Jan. 1991.

Turner et al., "5 GHz band n79 wideband microacoustic filter using thin lithium niobate membrane", Electronics Letters, vol. 55, No. 17, pp. 942-944, Aug. 2019.

Wagner et al., "Investigations of a new design concept for wideband hybrid ladder filters", in Proceedings of IEEE International Ultrasonics Symposium (IUS), pp. 2564-2567, Oct. 2019.

Wang et al., "Low TCF lithium tantalite contour mode resonators", in Proceedings of IEEE International Frequency Control Symposium (FCS), pp. 1-4, May 2014.

Weis et al., "Lithium niobate: Summary of physical properties and crystal structure", Applied Physics A, Solids and Surfaces, vol. 37, No. 4, pp. 191-203, Aug. 1985.

Yanagitani et al., "C-axis Zig-Zag ZnO film ultrasonic transducers for designing longitudinal and shear wave resonant frequencies and modes", IEEE Transactions on Ultrasonics, Ferroelectrics, and Frequency Control, vol. 58, No. 5, pp. 1062-1068, May 2011.

Yanagitani et al., "Giant shear mode electromechanical coupling coefficient k15 in C-axis tilted ScAIN films", in Proceedings of IEEE International Ultrasonics Symposium, pp. 2095-2098, Oct. 2010.

Yang et al., "4.5 GHz lithium niobate MEMS filters with 10% fractional bandwidth for 5G front-ends", Journal of Microelectromechical Systems, vol. 28, No. 4, pp. 575-577, Aug. 2019.

Yang et al., "A 1.65 GHz lithium niobate A1 resonator with electromechanical coupling of 11.4% and Q of 3112", in Proceedings of IEEE International Conference Micro Electro Mechical Systems, pp. 875-878, Jan. 2019.

Yang et al., "A C-band lithium Niobate MEMS Filter with 10% fractional bandwidth for 5G front-ends", in Proceedings of IEEE International Ultrasonics Symposium, pp. 1981-1984, Oct. 2019.

Yang et al., "Scaling acoustic filters towards 5G", in IEDM Tech. Dig., pp. 36-39, Dec. 2018.

Yang et al., "Toward Ka band acoustics: Lithium niobate asymmetrical mode piezoelectric MEMS resonators", in Proceedings of IEEE International Frequency Control Symposium (IFCS), pp. 1-5, May 2018.

Yang, et al., "5 GHz lithium niobate MEMS resonators with high FoM of 153", in Proceedings of IEEE 30th International Conference on Micro Electro Mechanical Systems (MEMS), pp. 942-945, Jan. 2017.

Yokoyama et al., "Highly piezoelectric co-doped AIN thin films for wideband FBAR applications", IEEE Transactions on Ultrasonics, Ferroelectrics, and Frequency Control, vol. 62, No. 6, pp. 1007-1015, Jun. 2015.

Zuo et al., "Hybrid filter design for 5G using IPD and acoustic technologies", in Proceedings of IEEE International Ultrasonics Symposium (IUS), pp. 269-272, Oct. 2019.

Kimura et al., "A high velocity and wideband SAW on a thin LiNbO3 plate bonded on a Si substrate in the SHF range", in Proceedings of IEEE International Ultrasonics Symposium (IUS), pp. 1239-1248, Oct. 2019.

Nakamura et al., "Partial domain inversion in LiNbO3 plates and its applications to piezoelectric devices", in Proceedings IEEE Ultrasonics Symposium, pp. 719-722, Nov. 1986.

* cited by examiner

700A

700B

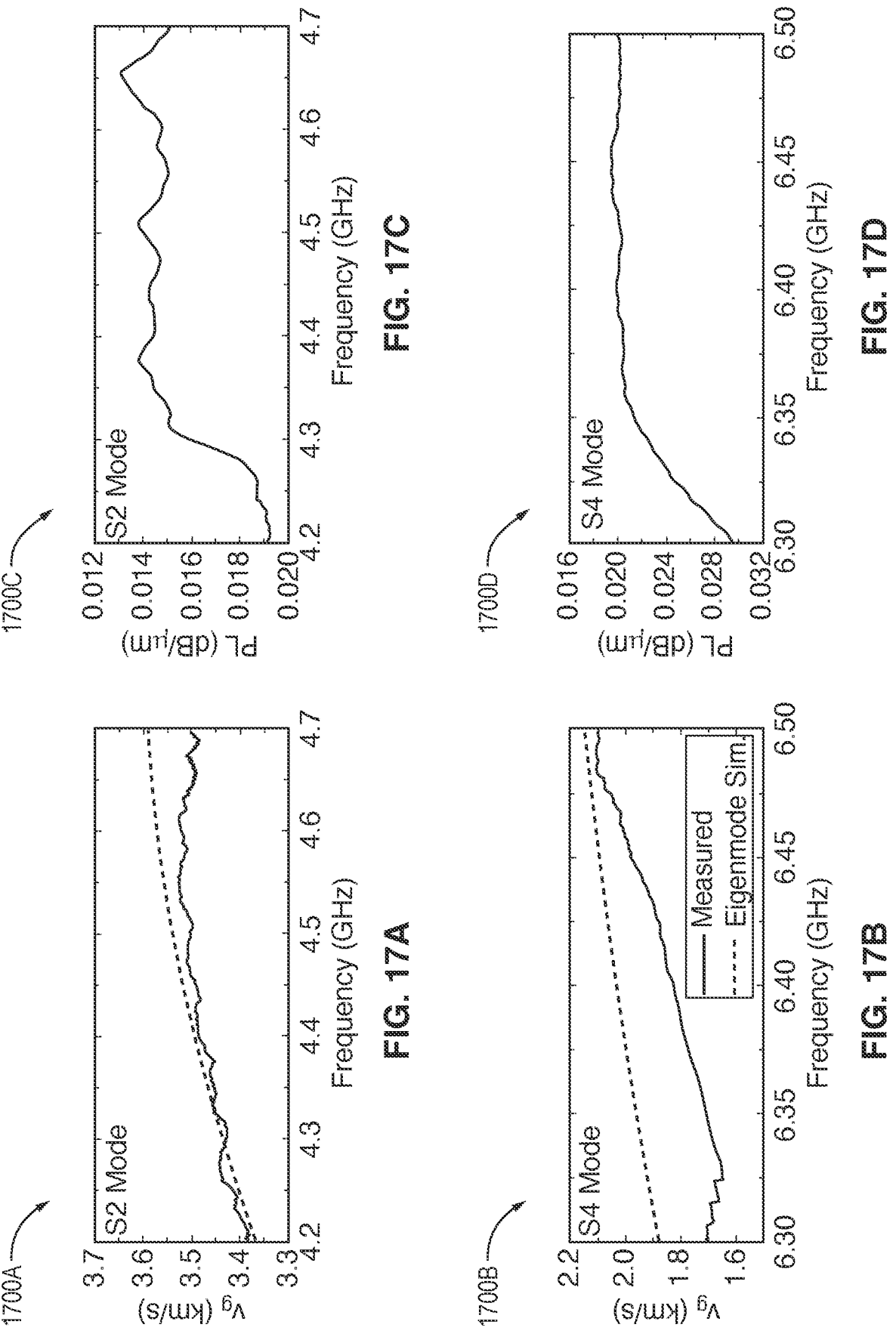

Convert an electromagnetic signal into a Lamb wave
1810A

Propagate the Lamb wave in a mode
1820A

1800A

Convert a first electromagnetic signal into a Lamb wave
1810B

Propagate the Lamb wave in a mode
1820B

Convert the Lamb wave into a second electromagnetic signal
1830B

Output the second electromagnetic signal
1840B

1800B

HIGHER ORDER LAMB WAVE ACOUSTIC DEVICES WITH COMPLEMENTARILY-ORIENTED PIEZOELECTRIC LAYERS

RELATED APPLICATIONS

The present Application claims priority to U.S. Patent Provisional Application No. 63/221,487, filed Jul. 14, 2021, and entitled "HIGHER ORDER LAMB WAVE ACOUSTIC DEVICES WITH COMPLEMENTARILY ORIENTED PIEZOELECTRIC THIN FILMS," which is incorporated herein by reference in its entirety.

STATEMENT REGARDING FEDERALLY SPONSORED RESEARCH

This invention was made with government support under Grant No. 1824320 awarded by the National Science Foundation. The government has certain rights in the invention.

TECHNICAL FIELD

Embodiments of the disclosure relate generally to acoustic devices (e.g., transducers), and more specifically, relate to higher order lamb wave acoustic devices with complementarily-orientated piezoelectric layers.

BACKGROUND

Emerging fifth-generation (5G) New Radio (NR) has sparked the recent development of various radio frequency (RF) signal processing functions. More specifically, enhanced mobile broadband (eMBB), as one 5G application, aims to communicate at higher center frequencies with broader bandwidth than the current fourth-generation (4G) wireless communication. With the Third Generation Partnership Project (3GPP) releasing the first group of frequency band specifications for 5G NR, the RF spectrum between 3 and 6 gigahertz (GHz) is believed to be the primary venue for the initial 5G eMBB deployment. This frequency range provides a well-balanced availability of large bandwidths and low free path loss, and it is considered compatible with the current RF front-end architecture. Therefore, implementing the envisioned 5G NR at sub-6 GHz may lie in the development of RF signal processing components (e.g., acoustic filters) to accommodate the requirements of 5G NR.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIGS. 17A-17D are graphs showing plots of propagation parameters of various orders of Lamb waves, in accordance with one or more embodiments of the present disclosure.

Figures 1A, 1B:
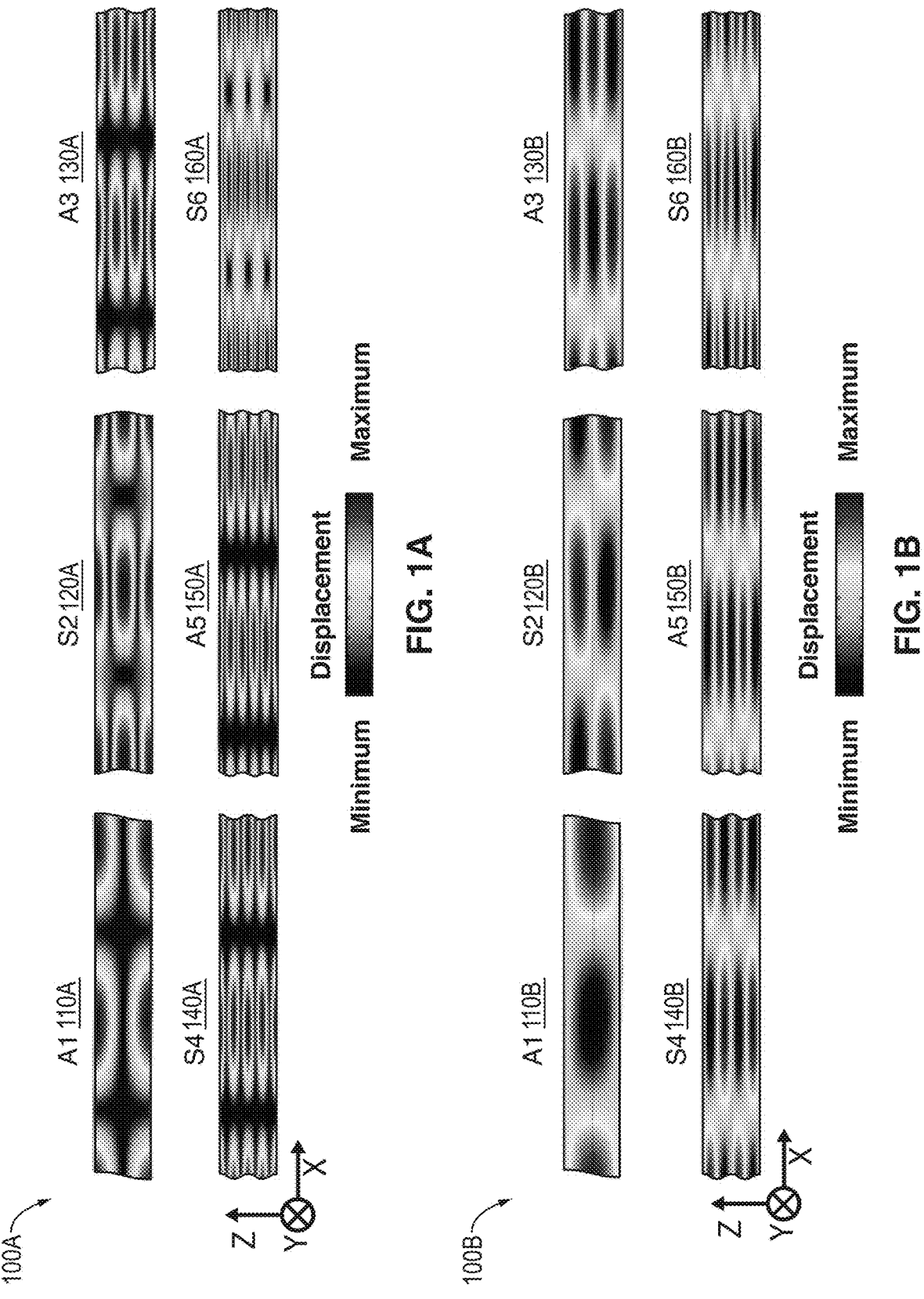
FIGS. 1A-1B are images showing vibrational mode shapes of higher-order mode Lamb waves, in accordance with one or more embodiments of the present disclosure.

While embodiments of the present invention are susceptible to various modifications and alternative forms, exemplary embodiments thereof are shown by way of example in the drawings and are herein described in detail. It should be understood, however, that the description of exemplary embodiments is not intended to limit the invention to the particular forms disclosed, but on the contrary, the intention is to cover all modifications, equivalents and alternatives falling within the spirit and scope of the in accordance with one or more embodiments of the present disclosure.

DETAILED DESCRIPTION

The technology now will be described more fully hereinafter with reference to the accompanying drawings, in which some, but not all embodiments are shown. Indeed, the invention may be embodied in many different forms and should not be construed as limited to the embodiments set forth herein; rather, these embodiments are provided so that this disclosure will satisfy applicable legal requirements.

Likewise, many modifications and other embodiments of the technology described herein will come to mind to one of skill in the art to which the disclosure pertains having the benefit of the teachings presented in the foregoing descriptions and the associated drawings. Therefore, it is to be understood that the invention is not to be limited to the specific embodiments disclosed and that modifications and other embodiments are intended to be included within the scope of this disclosure. Although specific terms are employed herein, they are used in a generic and descriptive sense only and not for purposes of limitation.

Unless defined otherwise, all technical and scientific terms used herein have the same meaning as commonly understood by one of skill in the art to which embodiments described herein pertain. Although any methods and materials similar to or equivalent to those described herein can be used in the practice or testing of embodiments of the present invention, the preferred methods and materials are described herein.

Lamb waves refer to a group of elastic waves in which particle motion lies in a plane defined by the direction of wave propagation and the plane normal perpendicular to the plane. Lamb wave solutions can be assorted into various types of modes, including the symmetrical mode and the antisymmetric mode, based on the symmetry of the motion about the central plane. Within each category, different modes can be further named according to the number of the nodal planes (XY planes with X-axis along the lateral direction) in the thickness (Z-axis) direction. For instance, the displacement of the first order antisymmetric (A1) mode is antisymmetric about the central plane, and one nodal plane can be identified. Similarly, higher-order modes are named.

In devices where the thickness over lateral wavelength ratio ($h/\lambda$) is small, such as radio frequency (RF) thin-film piezoelectric devices, Lamb waves can be further classified by the dominant stress component. The thickness-shear (Txz) component is dominant in odd-order antisymmetric modes (e.g., A1 mode) and in even-order symmetric modes (e.g., second-order symmetric (S2) mode). In contrast, the thickness normal stress (Tz) component is dominant in even-order antisymmetric modes (e.g., second-order asymmetric (A2) mode) and odd-order symmetric modes (e.g., first-order symmetric (S1) mode).

One potential path to enable 5G acoustic devices that meet the 5G NR standard is to scale down one or more dimensions of acoustic devices (e.g., RF acoustic devices) (e.g., film thickness and electrode feature size) for attaining a higher center frequency and matching the system impedance in order to operate at the sub-6 GHz bands. Examples of acoustic devices include resonant devices (e.g., resonators and filters), non-resonant devices (e.g., delay lines), surface Lamb wave (SAW) devices, film bulk acoustic resonators (FBAR), etc. Such acoustic devices can leverage piezoelectric materials.

Some challenges prohibit such an approach to meet the 5G NR standard. For example, some acoustic devices cannot provide adequate fractional bandwidth (FBW) due to the limited effective electromechanical coupling. As another example, merely reducing the dimensions of acoustic devices can result in increased insertion loss at higher frequencies, due to the exacerbated material damping, electrical loading, and the more pronounced surface losses. As yet another example, scaling down the one or more dimensions of an acoustic device (e.g., film thickness, electrode width) may lead to worsened power handling and increased nonlinearity because more acoustic energy is concentrated in a smaller volume. To address at least some of these challenges, several types of acoustic platforms have been investigated, including transferred thin films on costly substrates, new materials and acoustic modes with larger piezoelectric coefficients, and incorporated additional lumped electromagnetic elements.

Some acoustic devices, such as A1 mode Lamb wave acoustic devices, have been demonstrated with low loss, wide bandwidth, and large feature sizes. However, several bottlenecks have emerged for further improving A1 mode Lamb wave acoustic devices such as the piezoelectric layer (e.g., thin film) thickness reduces to less than 600 nm for operation beyond 3 GHz frequencies. For example, a thinner piezoelectric layer can lead to more severe surface losses, thus limiting the quality factor (Q) of the demonstrated A1 acoustic resonators (e.g., Q below 400), and the propagation loss (PL) of A1 acoustic delay lines (ADLs) (e.g., above 0.02 decibel (dB)/micrometer (μm)). Moreover, lateral field excited A1 devices with spurious mode suppression have a small capacitance per unit area, which can result in a relatively large footprint. Additionally, the piezoelectric layer can bear severe thermally induced nonlinearity because of the limited thermal conductance to surroundings.

To address these issues, one alternative for operating at 5G NR bands with a thicker piezoelectric layer is to excite the higher-order Lamb wave modes. However, the electromechanical coupling can diminish at a higher mode order when excited with the top-electrode-only topology due to the partial cancellation of the generated charge in the thickness direction. Therefore, advancing such acoustic devices calls for a new paradigm for enabling GHz higher-order Lamb wave modes.

For example, FIGS. 1A-1B are images 100A and 100B showing vibrational mode shapes of higher-order mode Lamb waves, in accordance with one or more embodiments of the present disclosure. More specifically, FIG. 1A shows a diagram 100A illustrating displacement about a central plane with respect to a first-order antisymmetric (A1) mode 110A, a second-order symmetric (S2) mode 120A, a third-order anti-symmetric (A3) mode 130A, a fourth-order symmetric (S4) mode 140A, a fifth-order anti-symmetric (A5) mode 150A and a sixth-order symmetric (S6) mode 160A. FIG. 1B shows a diagram 100B illustrating a thickness-shear (Txz) component with respect to an A1 mode 110B, an S2 mode 120B, an A3 mode 130B, an S4 mode 140B, an A5 mode 150B and an S6 mode 160B.

More specifically, in piezoelectric devices (e.g., RF thin-film acoustic devices) where the thickness h over lateral wavelength $\lambda$ ratio (h/Z) is small, Lamb waves can be further classified by the dominant stress component. The Txz component is dominant in odd-order antisymmetric modes (e.g., A1) and even-order symmetric modes (e.g., S2). In contrast, the thickness normal stress (Tz) component is dominant in even-order antisymmetric modes (e.g., A2) and odd-order symmetric modes (e.g., S1). The thickness-shear type of Lamb wave modes excited by electric fields generated by electrodes of IDT can be observed due to the large piezoelectric strain constant(s) (e.g., e15) in some types of piezoelectric layers. Nevertheless, embodiments described herein can be readily applied to other orientations, other piezoelectric materials, or devices excited by the thickness electrical fields. Some modes of interest (e.g., A1, S2, and A3) are presented in FIGS. 1A-1B, showing the displacement and $T_{xz}$ within a period.

The number of displacement nodes and stress anti-nodes is the same as the mode order. For plates with small h/λ and electrically short boundary conditions, the resonant frequency ($f_N$) of an a Lamb wave having a mode order of N can be approximated by:

$$f_N \approx N/2h \cdot \sqrt{1/(\rho \cdot s_{55}^E)} \quad (1)$$

where ρ is the material density, and $s_{55}^E$ is the thickness-shear compliance constant. It can be observed that the resonant frequency is inversely proportional to the film thickness h and proportional to the mode order N.

For determining whether a Lamb wave mode can be excited by a lateral electrical field, the electromechanical coupling ($K^2$) can be calculated using the Berlincourt equation under a quasi-static approximation as follows:

$$K^2 = U_m^2/(U_e \cdot U_d) \quad (2)$$

$$U_m = ((T_i d_{ni} E_n + E_n d_{ni} T_i)/4) dS \quad (3)$$

$$U_e = (T_i s_{ij}^E T_j/2) dS \quad (4)$$

$$U_d = (E_m \epsilon_{mn}^T E_n/2) dS \quad (5)$$

where $U_m$, $U_e$, and $U_d$ are the mutual, elastic, and electric energy, respectively, m, n are integers from 1 to 3, while i,j are integers from 1 to 6. $T_i$, and $E_m$ are the stress and electrical field elements. $d_{ni}$, $s_{ij}^E$, and $\epsilon_{mn}^T$ are the piezoelectric, elastic, and dielectric constants, respectively, under the strain-charge form. For thickness-shear Lamb wave modes excited with lateral electrical fields, the corresponding parameters are $d_{15}$, $s_{55}^E$, and $\epsilon_{11}^T$. For plates with small h/λ, the stress fields can be further simplified as:

$$T_{xz}(x,z) = T_{xz0} \cdot T_{xz\_x}(x) \cdot |T_{xz\_z}(z) \quad (6)$$

$$T_{xz\_x}(x) = H(x - \lambda/2) \quad (7)$$

$$T_{xz\_z}(z) = \sin(N\pi/h \cdot z) \quad (8)$$

where $T_{xz\_x}$ and $T_{xz\_z}$ are the decoupled stress fields through the separation of variables in the X and Z directions, with the origin defined at the lower-left corner, $T_{xz0}$ is the field amplitude, and H( ) is the Heaviside function. Similarly, the electrical field excited by the top IDTs can be simplified as:

$$E_{xz}(x,z) = E_{xz0} \cdot E_{xz\_x}(x) \cdot E_{xz\_z}(z) \quad (9)$$

$$E_{xz\_x}(x) = H(x - \lambda/2) \quad (10)$$

$$E_{xz\_z}(z) = 1 \quad (11)$$

where $E_{xz\_x}$ and $E_{xz\_z}$ are the decoupled electrical fields, and $E_{xz0}$ is the amplitude. Using Equations 2-11, one can obtain $K^2$ of the N-th order Lamb wave mode (with dominant thickness-shear stress element) excited with IDTs as:

$$K^2 = (8/\pi^2) \cdot d_{15}^2 / (s_{55}^E \cdot \epsilon_{11}^T) \cdot 1/N^2 \text{ if } N = 1 \pmod 2 \quad (12)$$

$$= 0 \text{ if } N \neq 1 \pmod 2$$

where mod( ) is the modulus function. In Equation 12, the first term is $K^2$ for A1, of which the value is determined by the material properties. $K^2$ of the N-th order mode decays with $N^2$, and only the odd-order antisymmetric modes can be excited. Such a conclusion can be explained by visually examining the periodicity and polarity of stress fields along the thickness direction for even and odd-order modes (e.g., as shown in FIG. 1B). Assuming a simplified constant E across the thickness of the film, the mutual energy term calculated with Equation 3 would partially cancel out for the odd-order modes but cancel out for the even-order modes For example, for a 0.6 μm (600 nanometer (nm)) Z-cut lithium niobate (LiNbO$_3$) piezoelectric layer, the 600 nm thickness can be selected for high operation frequencies beyond 3 GHz while maintaining a high yield for the bonding process. Using Equations 1 and 12, A1 is at 2.98 GHz with a $K^2$ of 30.3%, S2 is at 5.96 GHz with a $K^2$ of 0, and A3 is at 8.93 GHz with a $K^2$ of 3.4%. Therefore, 5G NR bands above 3 GHz can utilize Z-cut LiNbO$_3$ films that are less than 600 nm thick, which leads to higher damping, larger footprint, and worse linearity. As will be described in further detail below with reference to FIG. 3, a thicker piezoelectric layer (e.g., 1.2 μm Z-cut LiNbO$_3$ piezoelectric layer) can lead to diminished $K^2$ for modes above 3 GHz. Therefore, the disclosed piezoelectric platform with better frequency scalability while maintaining wide bandwidth is of great value.

To address the above challenges in the art of acoustic devices, aspects of the present disclosure provide for higher order (e.g., gigahertz (GHz) higher order) Lamb wave acoustic devices with complementarily-orientated piezoelectric layers. In some embodiments, the piezoelectric layers include piezoelectric thin films (e.g., single-crystal or poly-crystal piezoelectric thin films). An acoustic device described herein can include a stack of at least two piezoelectric layers configured to propagate Lamb wave in a mode having an order corresponding to (e.g., equal to) a number of piezoelectric layers of the stack. For example, the stack can include a first piezoelectric layer and a second piezoelectric layer disposed on the first piezoelectric layer. The first piezoelectric layer can have a first cut plane orientation and the second piezoelectric layer can have a second cut plane orientation complementary to the first cut plane orientation.

The piezoelectric layers of the stack can each include an anisotropic material. In some embodiments, the first piezoelectric layer and the second piezoelectric layer are formed from the same material. In some embodiments, the first piezoelectric layer and the second piezoelectric layer are formed from different materials. For example, the anisotropic material can be a lithium-based material. Examples of lithium-based materials include lithium niobate (LiNbO$_3$) and lithium tantalate (LiTaO$_3$). As another example, the anisotropic material can be an aluminum-based material. Examples of aluminum-based materials include aluminum nitride (AlN) and aluminum scandium nitride (AlScN). As another example, the anisotropic material can be a potassium-based material. Examples of potassium-based materials include potassium niobate (KNbO$_3$) and potassium tantalate (KTaO$_3$). Although LiNbO$_3$, LiTaO$_3$, AlN, AlScN, KNbO$_3$, and KTaO$_3$ are specifically referred to herein, other materials that are suitable for use as piezoelectric layers with the disclosed properties are also viable alternatives. In some embodiments, a piezoelectric layer can include a Z-cut thin film. For example, the Z-cut thin film can be a Z-cut LiNbO$_3$ thin film.

In some embodiments, the acoustic device includes an acoustic resonator. More specifically, the acoustic device can include a complementarily-oriented multi-layer acoustic resonator. For example, the acoustic device can be a complementarily-oriented bilayer acoustic resonator (COBAR). In addition to the stack described above, the acoustic resonator can further include an interdigitated transducer (IDT) disposed on the stack. The IDT can include a first electrode (e.g., ground electrode connected to a ground line) and a second electrode (e.g., signal electrode connected to a signal line) each oriented in a transverse direction perpendicular to the longitudinal direction. The first electrode is separated from the second electrode by an electrode gap having a longitudinal distance affecting a resonant frequency. An example structure of a device including an acoustic resonator (e.g., COBAR) will be described below with reference to FIGS. 5A-5B.

In some embodiments, the acoustic device includes an acoustic delay line. More specifically, the non-resonant device can include a complementarily-oriented multi-layer acoustic delay line. For example, the non-resonant device can be a complementarily-oriented bilayer acoustic delay line (COB-ADL). In addition to the stack described above, the acoustic delay line can further include a first IDT disposed on a first end of the stack and configured to convert a first electromagnetic signal, traveling in the longitudinal direction, into the Lamb wave. The first IDT can include a first electrode (e.g., ground electrode connected to a ground line) and a second electrode (e.g., signal electrode connected to a signal line) each oriented in a transverse direction perpendicular to the longitudinal direction. The acoustic delay line can further include a second IDT disposed on a second end of the stack with a gap between the second IDT and the first IDT. The second IDT can include a third electrode (e.g., ground electrode connected to a ground line) and a fourth electrode (e.g., signal electrode connected to a signal line) each oriented in the transverse direction. The second IDT is configured to convert the Lamb wave into a second electromagnetic signal after a time delay affected by the length of the gap between the first IDT and the second IDT. An example structure of a device including an acoustic delay line (e.g., COB-ADL) will be described below with reference to FIGS. 9A-9B.

Embodiments described herein can achieve low-loss, large electromechanical coupling, and improved frequency scalability Lamb wave device solutions. Embodiments described herein can demonstrate high electromechanical coupling, low attenuation, and high operation frequencies to enable 5G NR acoustic solutions. For example, embodiments described herein can address the mutual energy cancellation of higher-order Lamb wave modes through changing the integrated value in Equation 4. In other words, if the sign of dis is locally flipped for, e.g., an LiNbO$_3$ film while the other parameters (e.g., $s_{55}^E$, and $\epsilon_{11}^T$) remain the same, it is feasible to operate at higher-order modes. In the process, as will be described in further detail below, embodiments described herein can achieve better frequency scalability while maintaining higher $K^2$ and Q compared to acoustic devices having a single piezoelectric layer. Further compared to acoustic devices having a single piezoelectric layer, insertion loss (IL) and propagation loss (PL) of multiple piezoelectric layer acoustic devices described herein can be reduced due at least in part to the increased piezoelectric material thickness. The IL of some devices (e.g., acoustic delay lines) can be further reduced using unidirectional IDT designs. Accordingly, embodiments described herein can enable low-loss wideband acoustic components (e.g., for 5G NR).

As an illustrative example, an acoustic resonator including a stack of complementarily-oriented Z-cut single crystal LiNbO$_3$ piezoelectric layers having a thickness of about 1.2 µm can exhibit S2 mode resonance at 3.05 GHz with a high Q of 657, and a large $K^2$ of 21.5% and S6 resonance at 9.05 GHz with a high Q of 636 and a $K^2$ of 3.71%, both of which are among the highest demonstrated for GHz higher-order Lamb wave acoustic resonators. As another illustrative example, an acoustic delay line including a stack of complementarily-oriented Z-cut single crystal LiNbO$_3$ piezoelectric layers having a thickness of about 1.2 min can achieve an average insertion loss of 7.5 dB and a propagation loss (PL) of 0.014 dB/µm at 4.4 GHz for S2 resonance. Notable acoustic passbands up to 15.1 GHz may be identified.

Figure 2:
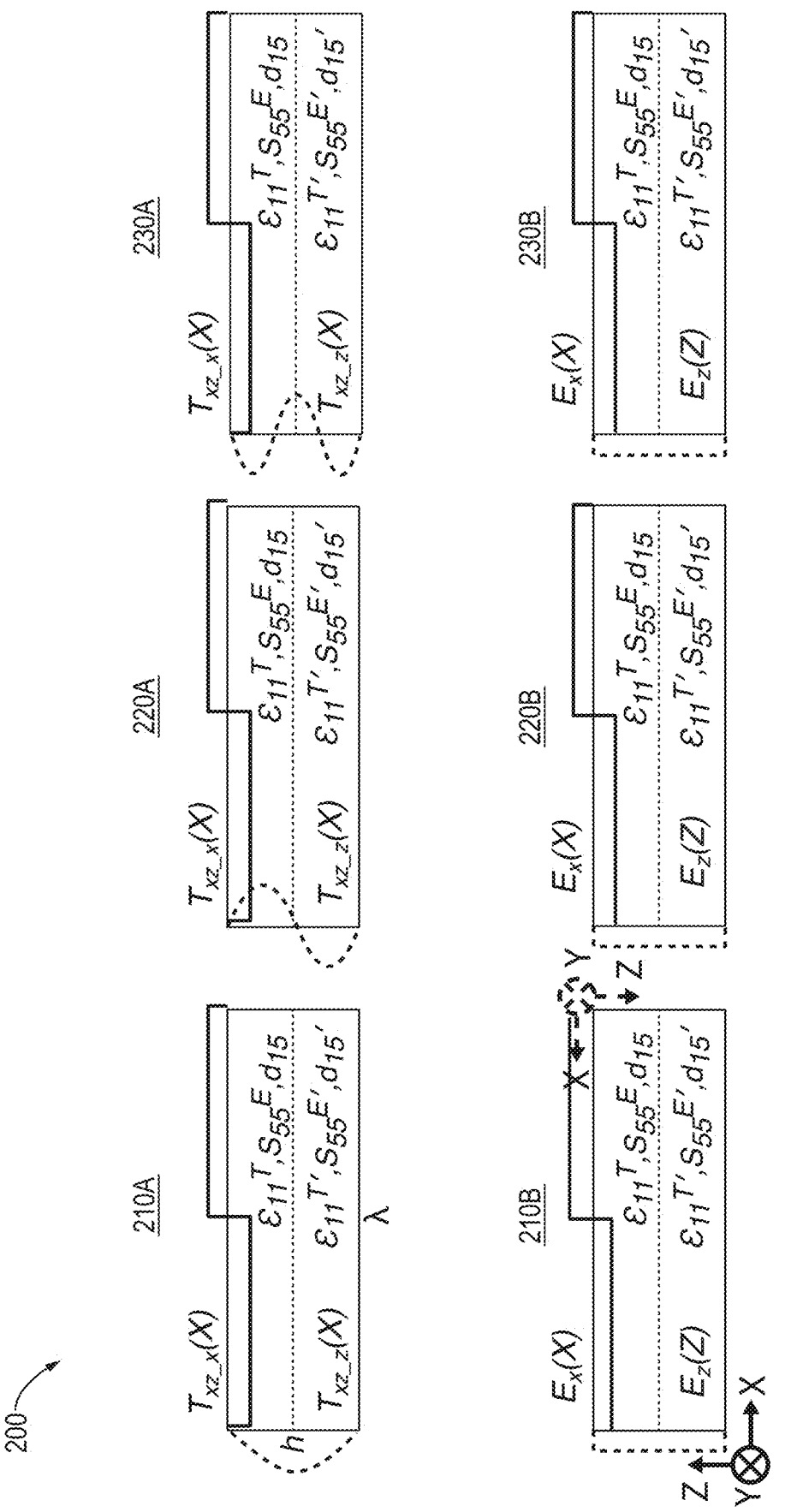
FIG. 2 are cross-sectional views of models for calculating electromechanical coupling of higher-order mode Lamb waves excited by lateral electric fields, in accordance with one or more embodiments of the present disclosure.

FIG. 2 are cross-sectional views 200 of models for calculating electromechanical coupling of higher-order mode Lamb waves excited by lateral electric fields, in accordance with one or more embodiments of the present disclosure. More specifically, this illustrative example illustrates a complementarily-oriented bilayer acoustic device (i.e., the stack of piezoelectric layers has an upper piezoelectric layer and a complementarily-oriented lower piezoelectric layer).

As described above, $T_{xz\_x}$ and $T_{xz\_z}$ are the decoupled stress fields through the separation of variables in the X and Z directions as shown in diagrams 210A-230A. Moreover, $E_{xz\_x}$ and $E_{xz\_z}$ are the decoupled electrical fields shown in diagrams 210B-230B, and $E_{xz0}$ is the amplitude. In this example, it is assumed the upper layer and the lower layer of the stack of piezoelectric layers have different parameters. More specifically, $d_{15}$, $s_{55}^E$, and $\epsilon_{11}^T$ for the upper layer and $d_{15}'$, $s_{55}^{E'}$, and $\epsilon_{11}^{T'}$ for the lower layer, where $d_{15}=-d_{15}'$, $s_{55}^E=s_{55}^{E'}$, and $\epsilon_{11}^T=\epsilon_{11}^{T'}$. $K^2$ can be calculated through Equations 2-11, with the only difference in Equation 3, where the mutual energy $U_m$ across the upper and lower sections is integrated separately. $K^2$ can then be expressed as:

$$K^2 = \left(8/\pi^2\right) \cdot d_{15}^2 / \left(s_{55}^E \cdot |\epsilon_{11}^T|\right) \cdot 4 / N^2 \text{ if } N = 2(\text{mod } 4) \qquad (13)$$
$$= 0 \text{ if } N \neq 2(\text{mod } 4)$$

Only a subset of Lamb wave modes (e.g., S2, S6 and S10) can be excited. This may be visually apparent from the periodicity and polarity of stress fields shown with reference to FIG. 1B. Different from the previous case, the mutual energy of the odd-order modes (e.g., A1, A3) across the upper and lower sections entirely cancel each other out. Moreover, the mutual energy in the modes like S4 is internally neutralized in each section. Illustratively, using Equation 13 and as will be described in further detail below with reference to FIG. 3, $K^2$ of an acoustic device including a stack of complementarily-oriented piezoelectric layers (e.g., a complementarily-oriented bilayer acoustic device having a stack of Z-cut single crystal LiNbO$_3$ with thickness of 1.2 µm) can overlap with the $K^2$ of a corresponding acoustic device including a single piezoelectric layer (e.g., a Z-cut single crystal LiNbO$_3$ layer with thickness of 0.6 µm) but with different mode orders. Accordingly, a complementarily-oriented bilayer acoustic device (e.g., COBAR or COB-ADL) described herein can achieve better frequency scalability compared to other acoustic devices, while maintaining high $K^2$.

Different from approaches involving sputtering multilayer tilted c-axis thin films, where the constants are partially modified, bonded piezoelectric thin films enable the implementation of acoustic devices described herein through the integration of thin films with different orientations. For example, for a piezoelectric layer (e.g., Z-cut single-crystal film) notated as a Euler angle of (0°, 0°, 0°) in the Z-X-Z format, at least one additional piezoelectric layer with a Euler angle of (180°, 180°, 0°) can satisfy the piezoelectric layer complementarity for material constants via matrix rotation. The rotated axis is plotted with dashed lines in FIG. 2. It should be understood and appreciated that this rotation is purely exemplary. Other rotations, e.g., (0°, 180°, 0°), may also be suitable.

The stack can include M layers of piezoelectric films, where M is greater than one, as long as alternating piezoelectric layers have a complementary orientation relatively to each other (e.g., same elastic and dielectric constants but different piezoelectric constants). Following the same procedure, it can be demonstrated that the $K^2$ of the N-th order Lamb wave mode in an acoustic device having an M-layer stack of complementarily-oriented piezoelectric layers is:

$$K^2 = \frac{2}{\pi^2} \cdot \frac{d_{15}^2}{s_{55}^E \cdot \epsilon_{11}^T} \cdot \left( \sum_{m=1}^{M} \int_{\frac{(m-1)\pi}{M}}^{\frac{m\pi}{M}} \sin(N\theta + m\pi) d\theta \right)^2 \tag{14}$$

It can be further demonstrated that an M-th order Lamb wave mode of this acoustic device has the same $K^2$ as that of a first-order Lamb wave mode (e.g., A1 or S1) in an acoustic device having a single piezoelectric layer. This can lead to even better frequency scalability, although at the cost of introducing additional spurious modes from the residual mutual energy of the lower and higher-order modes that do not entirely cancel out as in the bilayer case (i.e., M=2).

The above analysis assumes an ideal quasi-static case where h/X is near zero, and the electrical and acoustic fields are decoupled. To more accurately identify dispersion relations in piezoelectric layers, finite element analysis (FEA) can be used. For example, the FEA can include a two-dimensional (2D) eigenmode FEA.

Figure 3:
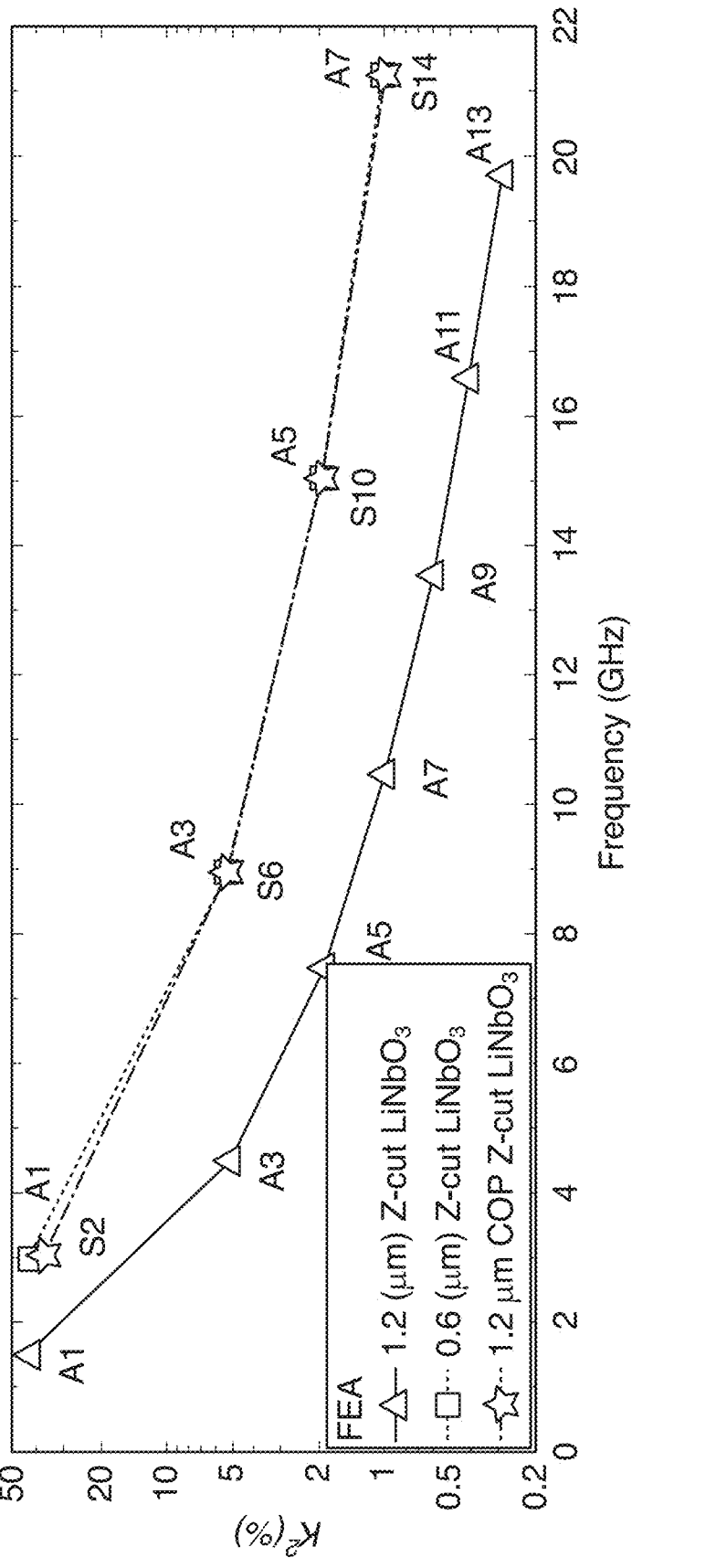
FIG. 3 is a graph showing simulated center frequency and electromechanical coupling of higher-order mode Lamb waves, in accordance with one or more embodiments of the present disclosure.

FIG. 3 is a graph 300 showing simulated center frequency and electromechanical coupling of higher-order mode Lamb waves in different film stacks, in accordance with one or more embodiments of the present disclosure. More specifically, the simulation can be performed using finite element analysis (FEA). Periodic boundary conditions in both the electrical and mechanical domains can be applied to the YZ plane. The top and bottom surfaces (XY planes) can be set as mechanically free. The electrically open and short boundary conditions are used, respectively. The simulations are performed on three types of acoustic devices having various piezoelectric layer configurations, namely a 0.6 μm thick Z-cut LiNbO₃, a 1.2 μm thick Z-cut LiNbO₃ and a 1.2 μm thick complementarily-oriented bilayer acoustic device (COP) Z-cut LiNbO₃.

First, the case of a small wavenumber (e.g., β=0.05 μm-1) is studied and compared to the calculations discussed with reference to Equations 13-14. The frequencies of Lamb modes of different mode orders are plotted against $K^2$ in FIG. 3, which is calculated as:

$$K^2 = (f_{free}^2 - f_{met}^2) f_{met}^2 \tag{15}$$

where $f_{free}$ and $f_{met}$ are the frequencies of the electrically open and short cases, respectively. The squares shown in FIG. 3 represent, for a number of respective modes (e.g., "A1", "A3", "A5", "A7") simulated using FEA, $K^2$ values (%) at respective frequencies for single layer of 0.6 μm Z-cut LiNbO₃. The triangles shown in FIG. 3 represent, for a number of respective modes (e.g., "A1", "A3", "A5", "A7", "A9", "A11", "A13") simulated using FEA, $K^2$ values at respective frequencies for a bilayer stack of 1.2 μm Z-cut LiNbO₃. The stars shown in FIG. 3 represent, for a number of respective modes (e.g., "S2", "S6", "A5", "S10", "S14") simulated using FEA, $K^2$ values at respective frequencies for a bilayer stack of 1.2 μm COP Z-cut LiNbO₃. As shown in FIG. 3, the $K^2$ of a 1.2 μm Z-cut COP LiNbO₃ can overlap with the calculated $K^2$ of a 0.6 μm Z-cut LiNbO₃ but with different mode orders. Accordingly, an acoustic device having a stack of complementarily-oriented piezoelectric layers described herein can achieve better frequency scalability while maintaining high $K^2$.

FIGS. 4A-4D are graphs 400A-400D showing simulated characteristics of higher-order mode Lamb waves, in accordance with one or more embodiments of the present disclosure. For example, the simulated characteristics can be finite element analysis (FEA) simulated characteristics. It is assumed in FIGS. 4A-4D that an acoustic device includes a bilayer stack of a 1.2 μm Z-cut COP LiNbO₃ for purposes of explanation and by way of simulated results.

Figures 4A, 4B:
FIGS. 4A-4D are graphs showing simulated characteristics of higher-order mode Lamb waves, in accordance with one or more embodiments of the present disclosure.

Graph 400A in FIG. 4A shows the relationship between the frequencies of higher-order mode Lamb waves (e.g., A1, S2, A3, S4, A5 and S6) at different wavenumbers β (between 0.05 μm⁻¹ and 4 μm⁻¹) under an electrically short condition. Cut-off frequencies ($f_c$) are observed for these modes, and the frequencies increase with larger β.

Graphs 400B in FIG. 4B shows the relationship between the $K^2$ values (%) of higher-order mode Lamb waves (e.g., A1, S2, A3, S4, A5 and S6) at different wavenumbers β (between 0.05 μm⁻¹ and 4 μm⁻¹). High $K^2$ over 35% can be observed for S2 modes with a long λ (or with operation frequencies close to $f_c$). $K^2$ declines for the A1 modes at a higher frequency (or with a larger h/λ). Similarly, the S6 mode follows the same trend, but with a smaller $K^2$. Another observation is that with a larger β beyond 1.2 μm-1, higher-order modes other than S2 and S6 can be efficiently excited, showing $K^2$ over 1%, because the electrical field cannot penetrate the entire thickness due to a larger h/λ, causing insufficient cancellation of the mutual energy (Equation 3).

Figures 4C, 4D:
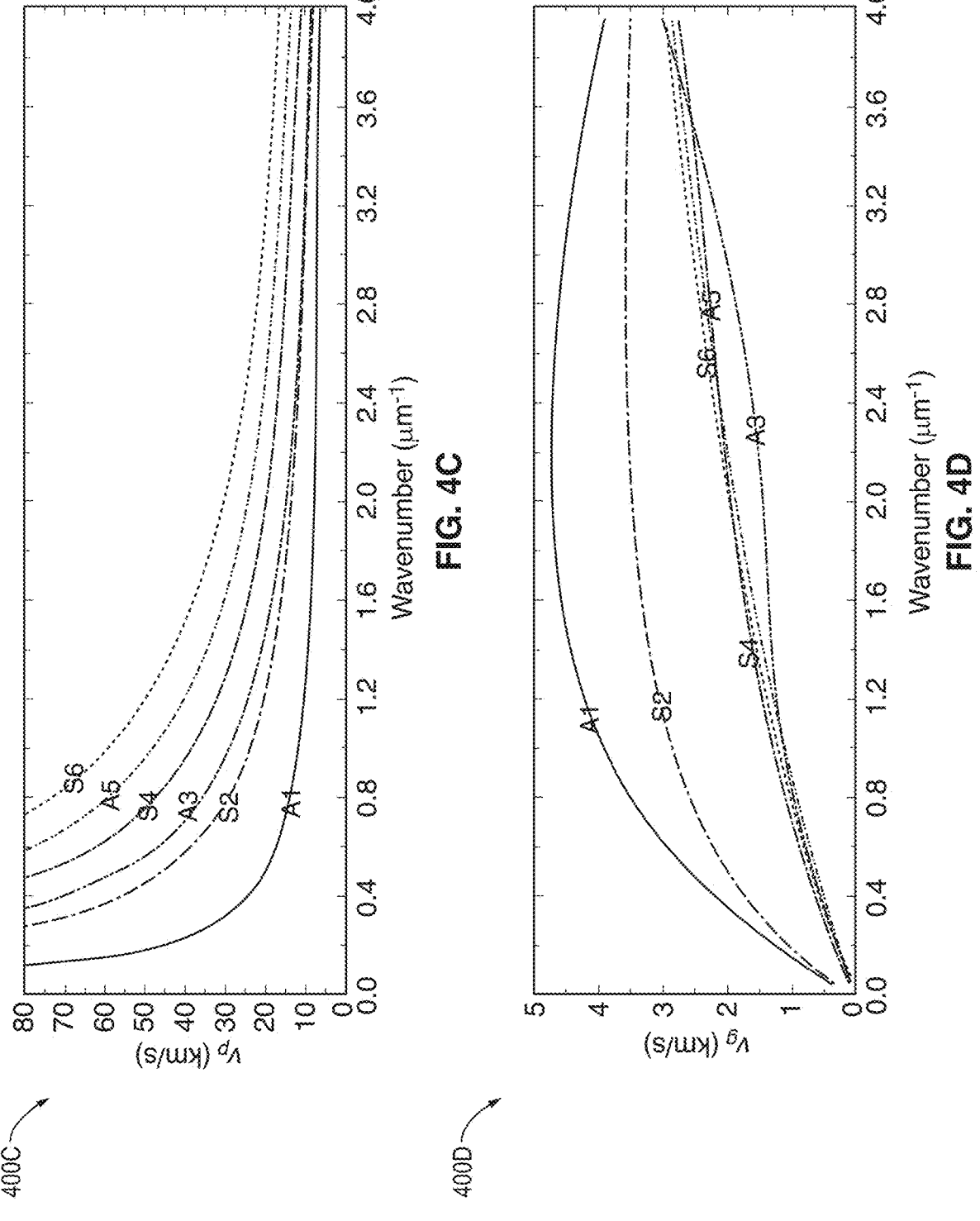

Graph 400C in FIG. 4C shows the relationship between phase velocity ($v_p$) (km/s) of higher-order mode Lamb waves (e.g., A1, S2, A3, S4, A5 and S6) at different wavenumbers β (between 0.05 μm⁻¹ and 4 μm⁻¹) for an electrically short case.

Graph 400D in FIG. 4D shows the relationship between group velocity ($v_g$) (km/s) of higher-order mode Lamb waves (e.g., A1, S2, A3, S4, A5 and S6) at different wavenumbers β (between 0.05 μm⁻¹ and 4 μm⁻¹) for an electrically short case. Phase velocity and group velocity can be obtained by:

$$v_p = 2\pi f/\beta \tag{16}$$

$$v_g = 2\pi \cdot \partial f/\partial \beta \tag{17}$$

Higher-order mode Lamb waves can simultaneously feature high $v_p$ (e.g., above 10 km/s), and low $v_g$ (e.g., below 5 km/s), which can be leveraged to build high frequency acoustic devices with large feature sizes, while allowing long group delay with a compact structure. Such characteristics, including high $K^2$ and $v_p$, can enable efficient piezoelectric transduction for 5G NR high-frequency acoustic applications (e.g., above 3 GHz).

In some embodiments, an acoustic device can include an acoustic resonator. More specifically, the acoustic resonator can be a complementarily-oriented multi-layer acoustic resonator having a stack of piezoelectric layers configured to propagate a Lamb wave in a mode having an order corresponding to a number of piezoelectric layers of the stack. For example, the stack of piezoelectric layers can include two piezoelectric layers, and the complementarily orientated multi-layer acoustic resonator can be a COBAR. However, such an example should not be considered limiting. Further details regarding complementarily-oriented multi-layer acoustic resonators will now be described below with reference to FIGS. 5A-5B.

Figures 5A, 5B:
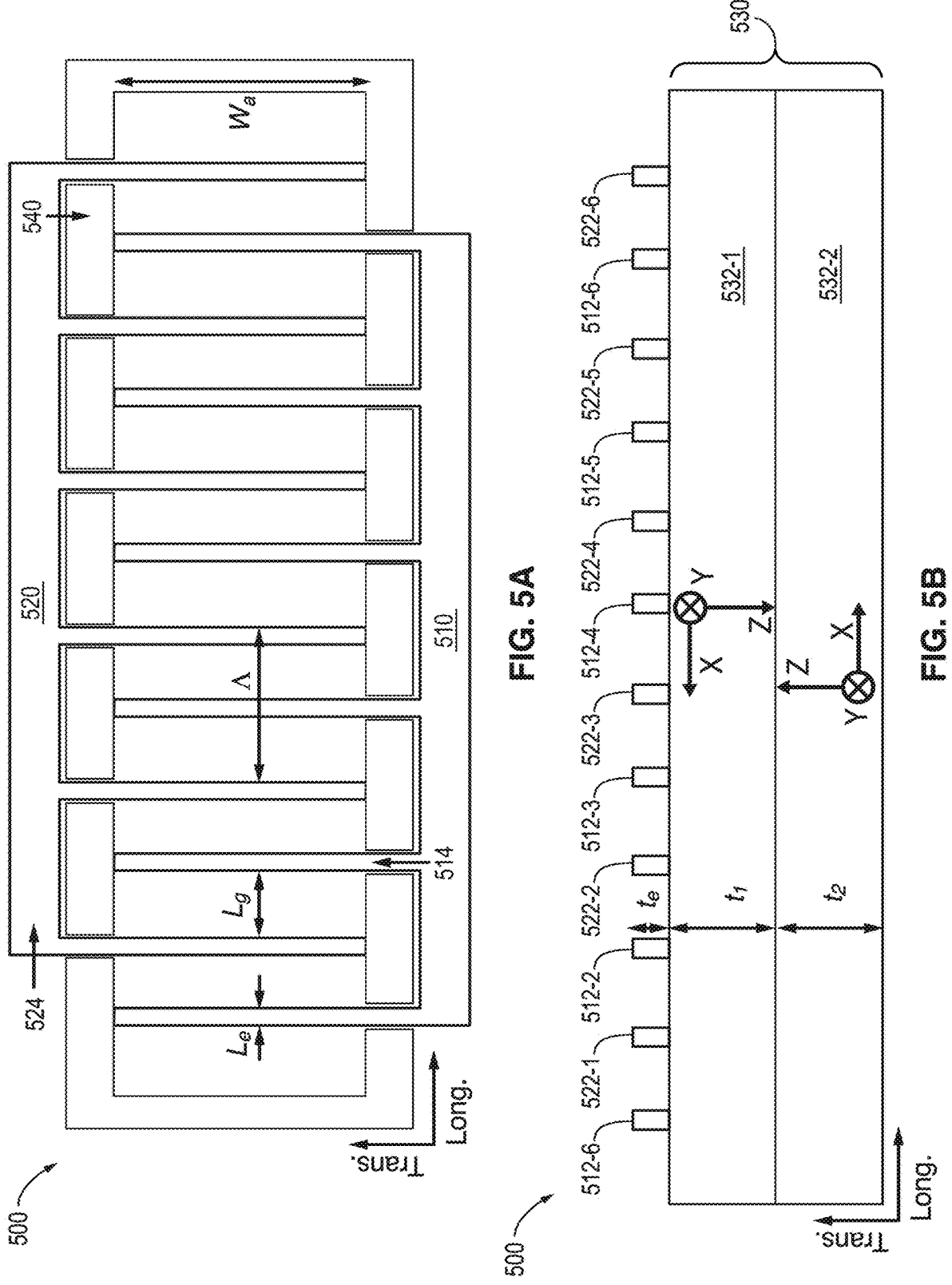
FIGS. 5A-5B are top and cross-sectional views of an acoustic resonator, in accordance with one or more embodiments of the present disclosure.

FIG. 5A is a top-down view of an acoustic resonator ("resonator") 500 and FIG. 5B is a cross-sectional view of the resonator 500, in accordance with one or more embodiments of the present disclosure. More specifically, the resonator 500 is a complementarily-oriented multi-layer acoustic resonator. In this illustrative example, the resonator 500 is a COBAR. However, such an example should not be considered limiting, and the resonator 500 can include any suitable number of piezoelectric layers.

As shown in FIGS. 5A-5B, the resonator 500 includes a ground line (GND) 510, a signal line (VIN) 520, an interdigitated transducer (IDT) including a number of ground electrodes 512-1 through 512-6 connected to GND 510 and a number of signal electrodes 522-1 through 522-6 connected to VIN 520, bus lines including bus line 524. The bus lines can be placed outside the resonant body for reducing the feedthrough capacitance.

The IDT can include any suitable number of electrode pairs (i.e., pairs of ground electrodes 512 and signal electrodes 522) in accordance with embodiments described herein. In some embodiments, the IDT includes between 7 electrode pairs and 15 electrode pairs. For example, the IDT can include 11 electrode pairs in an embodiment. The electrodes 512 and 522 can include any suitable conductive material(s) in accordance with embodiments described herein. Examples of suitable conductive materials include, but are not limited to, aluminum (Al), copper (Cu), gold (Au), silver (Ag), etc. In response to a voltage placed across the signal line 520, the signal line 520 is configured to generate a lateral electric field to excite a Lamb wave received by the resonator 500.

The resonator 500 can further include a stack 530 of piezoelectric layers, and the IDT is disposed on the stack 530. The stack 530 can be a suspended film above a carrier substrate (not shown). The stack can include an upper layer 532-1 disposed on a lower layer 532-2. The upper layer 532-1 and the lower layer 532-2 can include any suitable anisotropic material(s) in accordance with embodiments described herein. In some embodiments, at least one of the upper layer 532-1 or the lower layer 532-2 includes a single-crystal film. For example, at least one of the upper layer 532-1 or the lower layer 532-2 can include a Z-cut single crystal film (e.g., thin film). In some embodiments, at least one of the upper layer 532-1 or the lower layer 532-2 includes a poly-crystal film.

In some embodiments, at least one of the upper layer 532-1 or the lower layer 532-2 includes $LiNbO_3$. In some embodiments, at least one of the upper layer 532-1 or the lower layer 532-2 includes $LiTaO_3$. In some embodiments, at least one of the upper layer 532-1 or the lower layer 532-2 includes $KNbO_3$. In some embodiments, at least one of the upper layer 532-1 or the lower layer 532-2 includes $KTaO_3$.

In some embodiments, at least one of the upper layer 532-1 or the lower layer 532-2 includes AlN. In some embodiments, at least one of the upper layer 532-1 or the lower layer 532-2 includes an AlScN.

The upper layer 532-1 and the lower layer 532-2 can each have cut plane orientations ("orientations") that define a lateral electric field direction and maximize $K^2$ and $v_p$ to enable efficient piezoelectric transduction for the resonator 500. More specifically, the upper layer 532-1 has a first orientation and the lower layer 532-2 has a second orientation complementary to the first orientation (i.e., the cut plane axes of the lower layer 532-2 can be rotated about 180° from the upper layer 532-1, either through in-plane or out-of-plane rotation). For example, as shown, the lower layer 532-2 has an in-plane X axis and an out-of-plane Z axis that are each rotated 180° relative to the X and Z axes of the upper layer 532-1, respectively. In other words, in this example, the X and Z axes of the first orientation are in the opposite direction of the X and Z axes of the second orientation, respectively. An airbox can surround the resonator 500 to include the effects of the capacitive feedthrough between the electrodes in air, which can reduce the available $K^2$ of the resonator 500.

As shown in FIG. 5B, a thickness is defined for the upper layer 532-1 ("$t_1$") and a thickness is defined for the lower layer 532-2 ("$t_2$"). In some embodiments, $t_1$ is equal to $t_2$. In some embodiments, $t_1$ is different from $t_2$. The thickness of each of the layers 532-1 and 532-2 can be selected for setting the resonance above 3 GHz for a 5G NR band. In some embodiments, $t_1$ and $t_2$ each range between about 0.05 μm to about 2 μm. More particularly, $t_1$ and $t_2$ can each be about 0.6 μm (e.g., about 1.2 μm total if the stack 530 is a bilayer stack).

As shown in FIGS. 5A-5B, the electrodes 512 and 522 can have an electrode thickness or height ("$t_e$"), and the electrodes 512 and 522 can have an electrode width or length ("$L_e$") in the longitudinal direction. The electrodes 512 and 522 can have any suitable electrode thickness(es) and length(s) in accordance with embodiments described herein. For example, the electrode thickness can be selected for reducing electrical loading. In some embodiments, $t_e$ is between about 0.03 μm to about 1 μm. More particularly, $t_e$ can be about 0.3 μm. In some embodiments, $L_e$ can be between about 0.3 μm to about 4 μm. More particularly, $L_e$ can be about 2.5 μm.

As shown in FIG. 5A, a cell length ("Λ") associated with the IDT is defined between consecutive ground electrodes 512 (e.g., ground electrode 512-1 and ground electrode 512-2) and consecutive signal electrodes 522 (e.g., signal electrode 522-2 and signal electrode 522-3). The cell length can be any suitable distance in according with embodiments described herein. For example $L_e$ and Λ can be selected to enable a small ratio of Le/Λ to mitigate spurious modes. In some embodiments, Λ is between about 10 μm to about 300 μm. More particularly, Λ can be about 50 μm (e.g., if $L_e$ is about 2.5 μm). Additional piezoelectric slabs with a width of Λ/2 can be placed on the sides for keeping the periodicity.

As shown in FIG. 5A, a gap length ("$L_g$") is defined for an electrode gap between adjacent electrodes (e.g., between one of the signal electrodes 522 and one of the ground electrodes 512 that are adjacent within the acoustic resonator 500). More specifically, $L_g$ is a longitudinal distance of the electrode gap, which affects a resonant frequency. The gap length can be any suitable distance in according with embodiments described and illustrated herein. In some embodiments, $L_g$ can be between about 1 μm to about 25 μm. More particularly, $L_g$ can be about 22.5 μm.

As shown in FIG. 5A, an aperture width ("$W_a$") can be defined. The aperture width can be any suitable width in accordance with embodiments described herein. The aperture width can be set in consideration of both wave diffraction and electrical loading. In some embodiments, $W_a$ is between about 40 μm to about 60 μm. More particularly, $W_a$ can be about 65 μm. Moreover, the resonator 500 can further include a release window 540. The release window 540 can have any suitable width in accordance with embodiments described herein. In some embodiments, the release window 540 can have a width between about 5 μm to about 10 μm. More particularly, the release window 540 can have a width of about 8 μm.

Table I below provides example design parameters of a COBAR, including a pair of complementarily-oriented Z-cut single crystal LiNbO$_3$ piezoelectric layers having a total thickness of about 1.2 μm and IDT electrodes made of aluminum:

TABLE I

| Sym. | Parameter | Value |
|---|---|---|
| A | Cell length (μm) | 50 |
| $L_e$ | Electrode length (μm) | 2.5 |
| $L_g$ | Gap length (μm) | 22.5 |
| N | No. of electrode pairs | 11 |
| $W_a$ | Aperture width (μm) | 65 |
| $W_r$ | Release window width (μm) | 8 |
| $t_{LN}$ | LiNbO$_3$ thickness (nm) | 600 |
| $t_{Al}$ | Aluminum thickness (nm) | 300 |

Figures 6A, 6B:
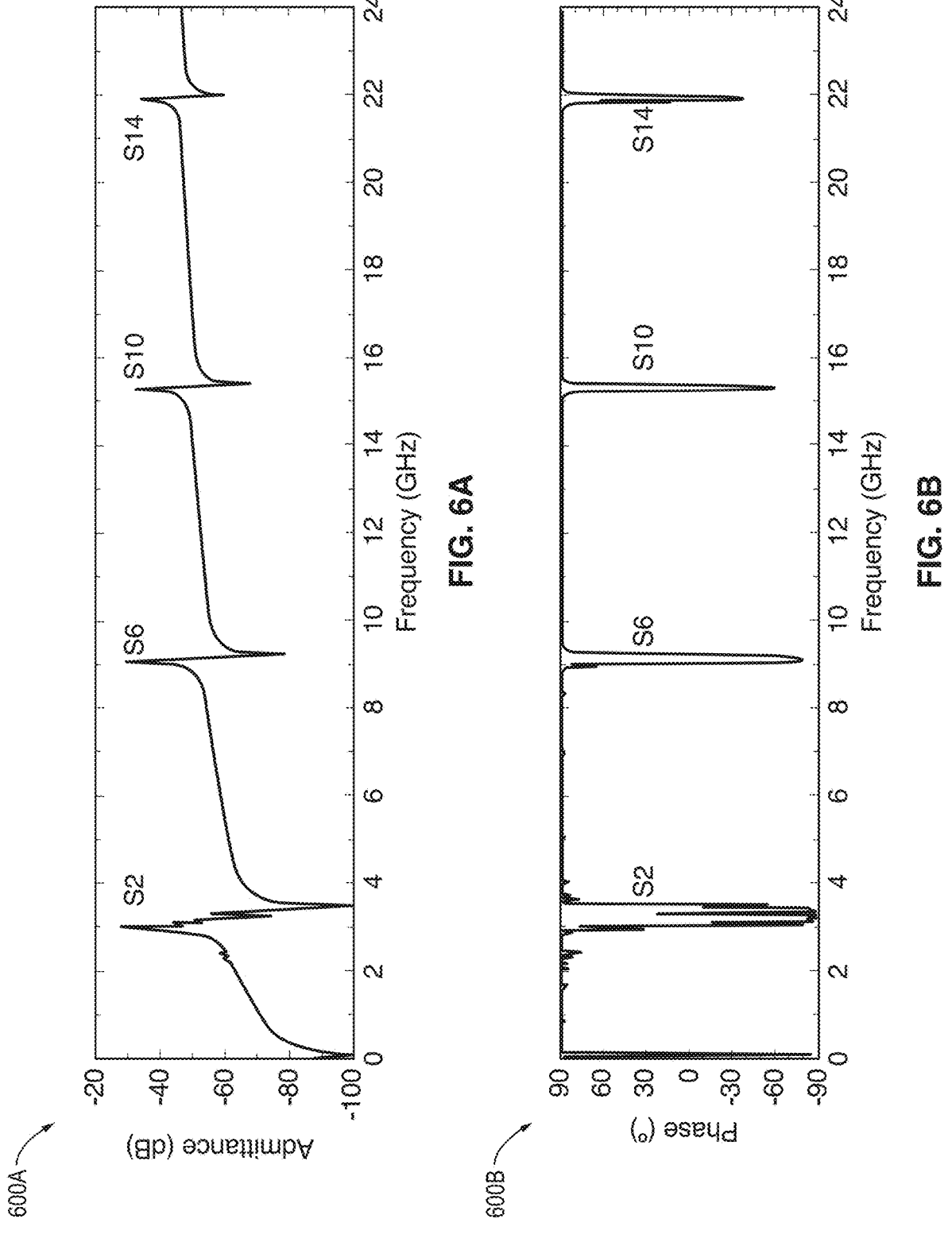
FIGS. 6A-6B are graphs showing simulated admittance and phase results of an acoustic resonator, in accordance with one or more embodiments of the present disclosure.
Figures 7A, 7B:
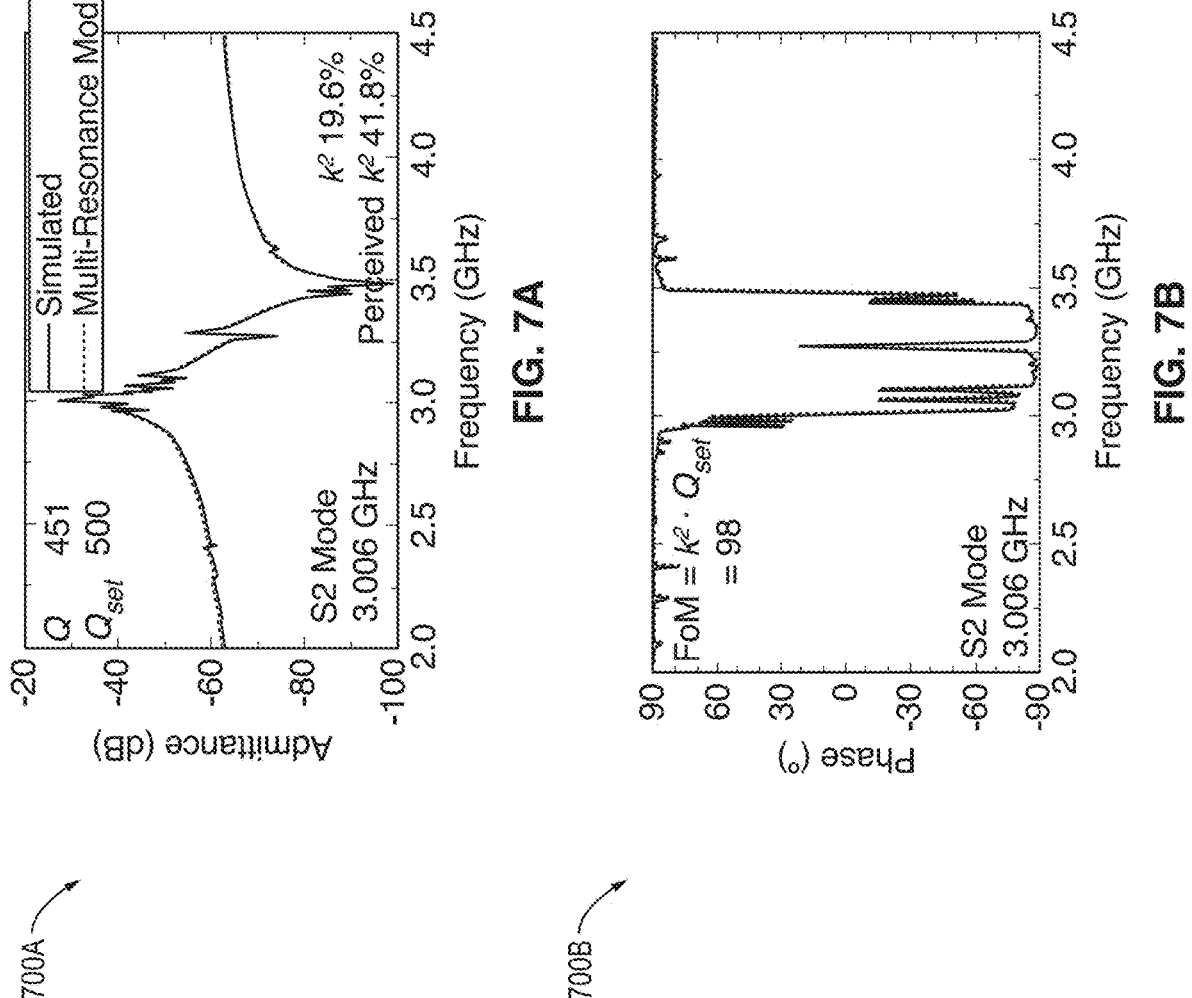
FIGS. 7A-7F are graphs showing zoomed-in simulation and multi-resonance fitted admittance response in amplitude and phase, in accordance with one or more embodiments of the present disclosure.
Figures 7C, 7D:
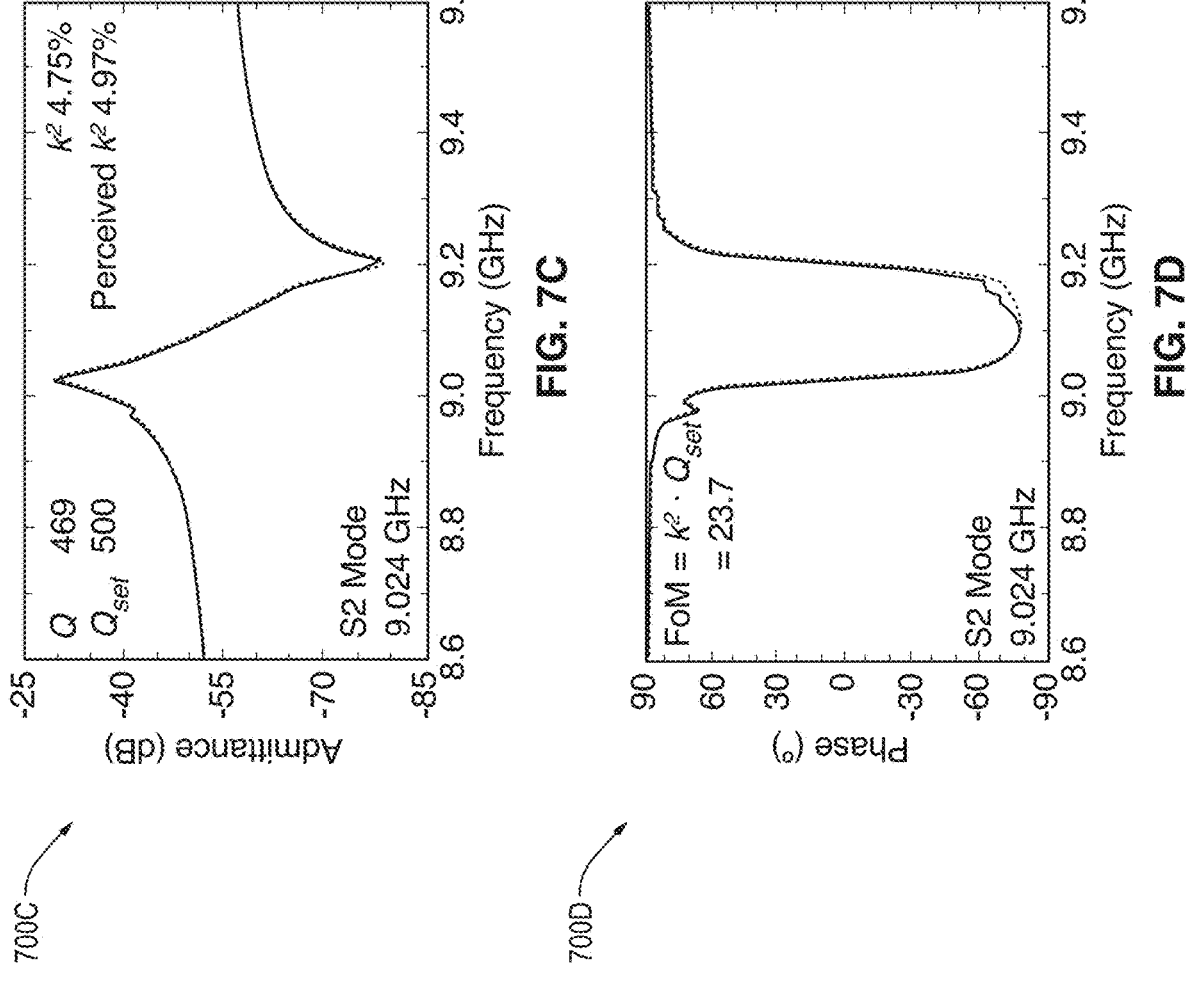
Figures 7E, 7F:
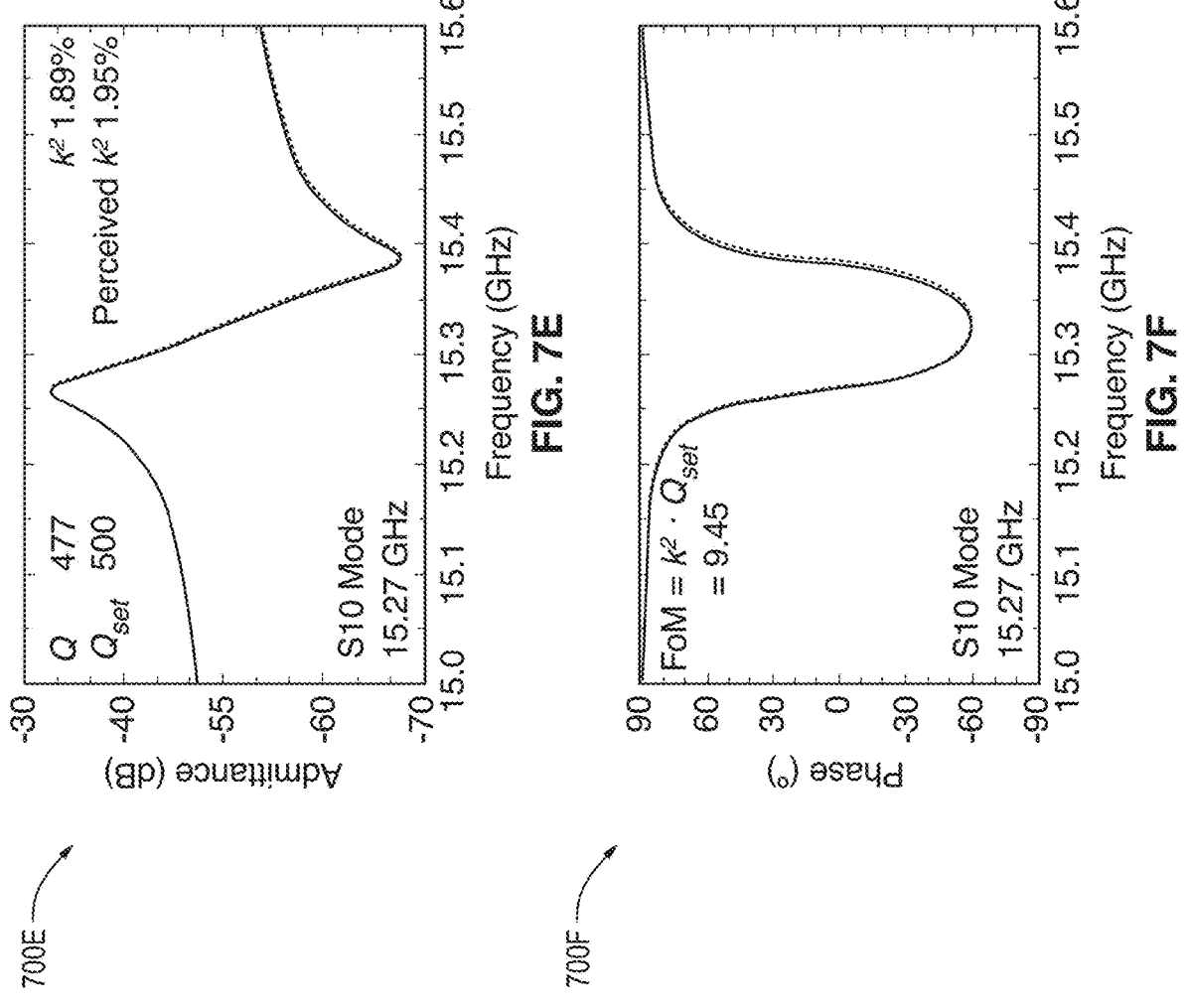

FIGS. 6A-6B are graphs 600A and 600B showing simulated results of an acoustic resonator, in accordance with one or more embodiments of the present disclosure. For example, the acoustic resonator can be the resonator 500 (e.g., COBAR) of FIGS. 5A-5B. Diagram 600A shows wideband admittance response in amplitude (dB) between frequencies of 0 GHz to 24 GHz and diagram 600B shows wideband admittance response in phase (°) between frequencies of 0 GHz to 24 GHz. As derived in Equation 13 above and as shown in the simulation of FIG. 3, only a subset of the higher-order modes (e.g., S2, S6, S10) are excited.

FIGS. 7A-7F are graphs 700A-700F showing zoomed-in simulation and multi-resonance fitted admittance response in amplitude and phase, in accordance with one or more embodiments of the present disclosure. Diagram 700A shows zoomed-in wideband admittance response in amplitude (dB) between frequencies of 2 GHz to 4.5 GHz and diagram 700B shows wideband admittance response in phase (°) between frequencies of 2 GHz to 4.5 GHz. More specifically, diagrams 700A and 700B correspond to the S2 mode.

Diagram 700C shows zoomed-in wideband admittance response between frequencies of 8.6 GHz to 9.6 GHz in amplitude (dB) and diagram 700D shows wideband admittance response between frequencies of 8.6 GHz to 9.6 GHz in phase (°). More specifically, diagrams 700C and 700D correspond to the S6 mode.

Diagram 700E shows zoomed-in wideband admittance response between frequencies of 15 GHz to 15.6 GHz in amplitude (dB), and diagram 700F shows wideband admittance response between frequencies of 15 GHz to 15.6 GHz in phase (°). More specifically, diagrams 700E and 700F correspond to the S10 mode.

The perceived $K^2$ of each mode ("$k_{perceived}^2$") shown in FIGS. 7A-7F is calculated as:

$$k_{perceived}^2 = \pi^2/8 \cdot [(f_p/f_s)^2] - 1 \qquad (18)$$

where $f_s$ and $f_p$ are the resonant frequency and anti-resonant frequency, respectively, defined as the frequency points with the minimum and maximum impedance. S2 has a perceived $K^2$ of 41.8% at 3.006 GHz. On the other hand, S6 and S10 have perceived $K^2$ of 4.97% and 1.95% at 9.024 GHz and 15.27 GHz, respectively. The obtained fs and perceived $K^2$ agree with those extracted from eigenmode FEA shown in FIG. 4, with the slight reduction caused by capacitive coupling between IDT electrodes. More specifically, out of the total static capacitance ($C_0$) of 32.9 femtoFarads (fF), 6.8 fF is introduced by the capacitance in air, which can be mitigated using devices with a slightly smaller cell length A. One issue that can be observed is the in-band spurious modes ("spurious modes"). The spurious modes can originate from higher-order overtones of fundamental modes (A0, S0), higher-order overtones of S2, and mode conversion at the edge reflectors.

Figure 8:
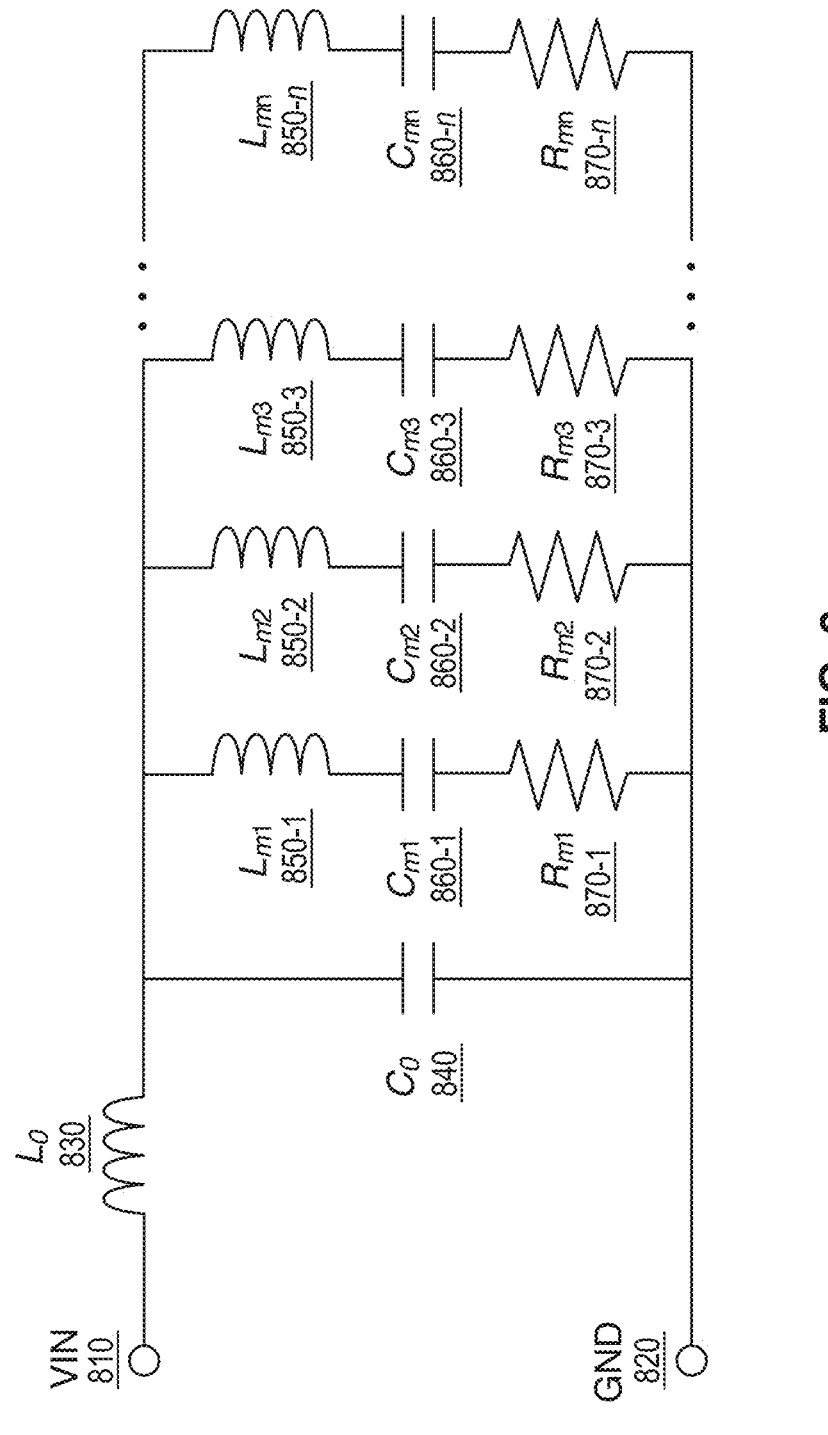
FIG. 8 is a schematic diagram of a multi-resonance model for extracting key parameters, in accordance with one or more embodiments of the present disclosure.

FIG. 8 is a schematic diagram ("diagram") 800 of a multi-resonance model for extracting key parameters, in accordance with one or more embodiments of the present disclosure. More specifically, the model can be a multi-branch modified Butterworth-Van-Dyke (MBVD) model, where each motional branch represents a respective mode. The diagram 800 shows a signal line (VIN) 810, a ground line (GND) 820, a series inductance (Ls) 830, a static capacitance ($C_0$) 840, and a number of motional elements. The motional elements can include motional inductances ($L_m$) $L_{m1}$ 850-1 through $L_{mn}$ 850-n, motional capacitances ($C_m$) $C_{m1}$ 860-1 through $C_{mn}$ 860-n, and motional resistances ($R_m$) $R_{m1}$ 870-1 through $R_{mn}$ 870-n. As shown, each group of i-th motional elements can be connected in series to form a respective i-th branch (e.g., $L_{m1}$ 850-1, $C_{m1}$ 860-1 and $R_{m1}$ 870-1 are connected in series), and $C_0$ 840 and the n branches can be connected in parallel.

The i-th motional elements can be defined as follows:

$$R_{mi} = \pi^2/8 \cdot 1/(\omega_{si} C_0 k_i^2 Q_i) \qquad (19)$$

$$L_{mi} = \pi^2/8 \cdot 1/(\omega_{si}^2 C_0 k_i^2) \qquad (20)$$

$$C_{mi} = 8/\pi^2 \cdot C_0 k_i^2 \qquad (21)$$

where $\omega_{si}$ is the angular resonant frequency for the i-th motion elements, $k_i^2$ is the effective electromechanical coupling coefficient for the i-th motion elements, and $Q_i$ is the quality factor for the i-th branch. Ls 830 is included for modeling the IDT inductance in the measurement. Following a recursive procedure, the key parameters can be extracted, listed in the example Table II below, and also plotted in FIGS. 7A-7F.

Table II below provides example extracted key parameters from a COBAR simulation, in which the COBAR includes a pair of complementarily-oriented Z-cut single crystal LiNbO$_3$ piezoelectric layers having a total thickness of about 1.2 μm and IDT electrodes made of aluminum:

TABLE II

| Sym. | Value | Sym. | Value | Sym. | Value |
|---|---|---|---|---|---|
| $C_0$ | 32.9 fF | $L_s$ | 0 nH | n | 14 |
| $f_{s1}$ | 3.01 GHz | $k_1^2$ | 19.6% | $Q_1$ | 451 |
| $f_{s2}$ | 3.02 GHz | $k_2^2$ | 8.89% | $Q_2$ | 445 |
| $f_{s3}$ | 2.98 GHz | $k_3^2$ | 4.49% | $Q_3$ | 500 |
| $f_{s4}$ | 2.96 GHz | $k_4^2$ | 3.53% | $Q_4$ | 482 |

TABLE II-continued

| Sym. | Value | Sym. | Value | Sym. | Value |
|---|---|---|---|---|---|
| $f_{s5}$ | 3.06 GHz | $k_5^2$ | 2.82% | $Q_5$ | 408 |
| $f_{s6}$ | 3.10 GHz | $k_6^2$ | 2.00% | $Q_6$ | 413 |
| $f_{s7}$ | 3.28 GHz | $k_7^2$ | 0.61% | $Q_7$ | 495 |
| $f_{s8}$ | 3.45 GHz | $k_8^2$ | 0.03% | $Q_8$ | 460 |
| $f_{s9}$ | 3.47 GHz | $k_9^2$ | 0.02% | $Q_9$ | 462 |
| $f_{s10}$ | 3.61 GHz | $k_{10}^2$ | 0.01% | $Q_{10}$ | 584 |
| $f_{s11}$ | 9.02 GHz | $k_{11}^2$ | 4.75% | $Q_{11}$ | 469 |
| $f_{s12}$ | 8.97 GHz | $k_{12}^2$ | 0.22% | $Q_{12}$ | 699 |
| $f_{s13}$ | 15.3 GHz | $k_{13}^2$ | 1.89% | $Q_{13}$ | 477 |
| $f_{s14}$ | 21.9 GHz | $k_{14}^2$ | 0.99% | $Q_{14}$ | 499 |

The $K^2$ of the S2 mode is 19.6% (mode 1 in Table II corresponding to $f_{s1}$), because of the adjacent high $K^2$ S2 overtones and undertones (modes 2-10 in Table II corresponding to $f_{s2}$ through $f_{s10}$). These modes exist because of the thick A1 mode, which aims to lower the electrical loading for exposing Q. The $K^2$ of the S6 mode is 4.75% (corresponding to $f_{s11}$), and $K^2$ of the S10 mode is 1.89% (corresponding to $f_{s13}$), both showing a clean spectrum and high $K^2$.

In some embodiments, an acoustic device can include an acoustic delay line. More specifically, the acoustic delay line can be a complementarily-oriented multi-layer acoustic resonator having a stack of piezoelectric layers configured to propagate a Lamb wave in a Lamb mode having an order corresponding to a number of piezoelectric layers of the stack. For example, the stack of piezoelectric layers can include two piezoelectric layers, and the complementarily-orientated multi-layer acoustic resonator can be a COB-ADL. However, such an example should not be considered limiting. Further details regarding complementarily-oriented multi-layer acoustic resonators will now be described below with reference to FIGS. 9A-9B.

Figures 9A, 9B:
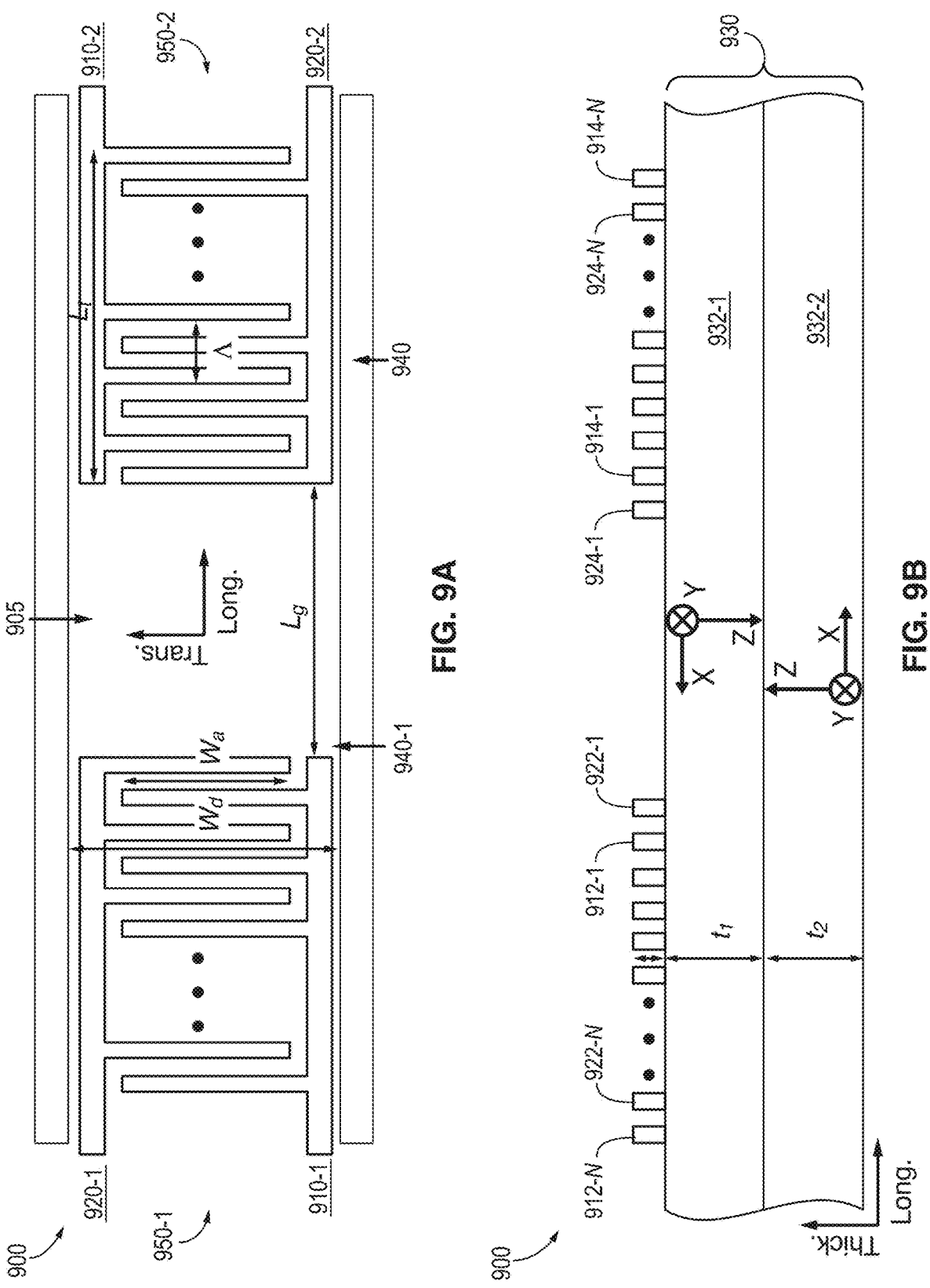
FIGS. 9A-9B are top and cross-sectional views of an acoustic delay line, in accordance with one or more embodiments of the present disclosure.

FIG. 9A is a top-down view of an acoustic delay line ("delay line") 900 and FIG. 9B is a cross-sectional view of the delay line 900, in accordance with one or more embodiments of the present disclosure. More specifically, delay line 900 is a complementarily-oriented multi-layer acoustic delay line. In this illustrative example, the delay line 900 is a COB-ADL. However, such an example should not be considered limiting.

As shown in FIGS. 9A-9B, the delay line 900 includes a waveguide 905. The waveguide 905 includes ground lines (GND) 910-1 and 910-2, signal lines (VIN) 920-1 and 920-2. The waveguide 905 further includes a first interdigitated transducer (IDT) including a number of ground electrodes 912-1 through 912-N connected to GND 910-1 and a number of signal electrodes 922-1 through 922-N connected to VIN 920-1. The Lamb waveguide 905 further includes a second IDT including a number of ground electrodes 914-1 through 914-N connected to GND 910-2 and a number of signal electrodes 924-1 through 924-N connected to VIN 920-2. More specifically, the first IDT and the second IDT are a pair of bidirectional transducers that are placed on respective longitudinal ends of the delay line 900. The electrodes 912, 914, 922 and 924 can include any suitable conductive material(s) in accordance with embodiments described herein. Examples of suitable conductive materials include, but are not limited to, aluminum (Al), copper (Cu), gold (Au), silver (Ag), etc.

The waveguide 905 further includes a stack 930 of piezoelectric layers, and the first and second IDTs are each disposed on the stack 930. The stack 930 can be a suspended film above a carrier substrate (not shown). As shown, the stack 930 includes an upper layer 932-1 disposed on a lower layer 932-2. The upper layer 932-1 and the lower layer 932-2 can each have cut plane orientations ("orientations") that define a lateral electric field direction and maximize $K^2$ and $v_p$ to enable efficient piezoelectric transduction for the delay line 900 having a complementary orientation relative to the upper layer 932-1. More specifically, the upper layer 932-1 and has a first orientation and the lower layer 932-2 has a second orientation complementary to the first orientation, similar to the upper layer 532-1 and the lower layer 532-2 described above with reference to FIGS. 5A-5B.

The upper layer 932-1 and the lower layer 932-1 can each be comprised of anisotropic materials similar to the upper layer 532-1 and the lower layer 532-2 described above with reference to FIGS. 5A-5B. The upper layer 932-1 and the lower layer 932-2 can have similar dimensions to the upper layer 532-1 and the lower layer 532-2 described above with reference to FIGS. 5A-5B.

For example, the upper layer 532-1 can have a thickness ("$t_1$") the lower layer 532-2 can have a thickness ("$t_2$"), as described above with reference to FIGS. 5A-5B. In some embodiments, $t_1$ is equal to $t_2$. In some embodiments, $t_1$ is different from $t_2$. The thickness of each of the layers 532-1 and 532-2 can be selected for setting the resonance above 3 GHz for 5G NR band. In some embodiments, $t_1$ and $t_2$ each range between about 0.3 μm to about 2 μm. More particularly, $t_1$ and $t_2$ can each be about 0.6 μm (e.g., about 1.2 μm total if the stack 530 is a bilayer stack).

As shown in FIG. 9A, the stack 930 can have a stack width ("$W_d$"). The stack 930 can have any suitable stack width. In some embodiments, $W_d$ is between about 60 μm to about 80 μm. More particularly, $W_d$ can be about 74 μm. As further shown in FIG. 9A, an aperture width ("$W_a$") can be defined. The aperture width can be any suitable width in accordance with embodiments described herein. The aperture width can be set in consideration of both wave diffraction and electrical loading. In some embodiments, $W_a$ is between about 40 μm to about 60 μm. More particularly, $W_a$ can be about 50 μm.

As shown in FIG. 9B, the electrodes 912, 914, 922 and 924 can have an electrode thickness or height ("$t_e$"). The electrodes 912, 914, 922 and 924 can have any suitable electrode thickness(es) in accordance with embodiments described herein. In some embodiments, $t_e$ is between about 0.02 μm to about 1 μm. More particularly, $t_e$ can be about 0.05 μm.

As shown in FIG. 9A, each of the IDTs can have a transducer length ("$L_T$"). The IDTs can have any suitable transducer length(s) in accordance with embodiments described herein. In some embodiments, the transducer length is between about 7 μm to about 12 μm. More particularly, the transducer length can be about 9.6 μm.

As shown in FIG. 9A, a gap length ("$L_g$") is defined for a gap between the first IDT and the second IDT. The gap length can be any suitable distance in accordance with embodiments described herein. In some embodiments, $L_g$ can be between about 10 μm to about 8000 μm. More particularly, $L_g$ can be between about 20 μm to about 1280 μm.

The electrodes 912, 914, 922 and 924 can have any suitable electrode width, which can be similar to the electrode width of the electrodes 512 and 522 described above with reference to FIGS. 5A-5B (i.e., $L_e$). In some embodiments, the electrode width is between about between about 0.2 μm to about 20 μm.

As shown in FIG. 9A, a cell length ("A") is defined between consecutive ground electrodes 912, 914 (e.g., ground electrode 912-1 and ground electrode 912-2) and consecutive signal electrodes 922, 924 (e.g., signal electrode 922-1 and signal electrode 922-2). The cell length can be any suitable distance in according with embodiments described herein. In some embodiments, A can be between about 0.4 µm to about 40 µm. More particularly, A can be about 2.4 µm. For example, $L_e$ and A can be selected to mitigate (e.g., eliminate) the cut-off phenomenon, while efficiently exciting Lamb waves having various higher-order Lamb modes (e.g., as shown in FIGS. 4A-4D).

As shown in FIG. 9A, the delay line 900 can further include a release window 940. The release window 940 can have any suitable width in accordance with embodiments described herein. In some embodiments, the release window 940 can have a width between about 5 µm to about 10 µm. More particularly, the release window 940 can have a width of about 8 µm.

In operation, a first electromagnetic signal received via a port 950-1 is converted by the first IDT into a Lamb wave through piezoelectricity. The Lamb wave is propagated in a mode corresponding to the number of piezoelectric layers of the stack. For example, the mode order can be equal to the number of piezoelectric layers of the stack. The mode can be excited by a lateral electric field generated by the first IDT. The second IDT can convert the Lamb wave into a second electromagnetic signal after a time delay determined by the gap between the first IDT and the second IDT. The second electromagnetic signal can be output via port 950-2. Further details regarding the operation of the delay lines 900 are described below with reference to FIG. 18B.

Table III below provides example design parameters of a COB-ADL including a pair of complementarily-oriented Z-cut single crystal $LiNbO_3$ piezoelectric layers having a total thickness of about 1.2 µm and IDT electrodes made of aluminum:

TABLE III

| Sym. | Parameter | Value |
|------|-----------|-------|
| A | Cell length (µm) | 2.4 |
| N | Number of cells | 4 |
| $L_g$ | Gap length (mm) | 0.02-1.28 |
| $L_t$ | Transd. length (µm) | 9.6 |
| $W_a$ | Aperture width (µm) | 50 |
| $W_d$ | Device width (µm) | 74 |
| $t_{LN}$ | $LiNbO_3$ thickness (nm) | 600 |
| $t_{Al}$ | Aluminum thickness (nm) | 50 |

The acoustic devices described herein (e.g., acoustic resonator and acoustic delay line) can be fabricated using any suitable techniques. For example, the stack of piezoelectric layers can be provided on a carrier substrate. The process can begin with defining the release windows via reactive-ion etching (RIE). For example, the release windows can be defined using inductively coupled plasma RIE (ICP-RIE). The IDT electrodes can then be deposited with evaporation and lift off. The structures can be released with a suitable etchant (e.g., xenon difluoride ($XeF_2$)).

Figures 10A, 10B:
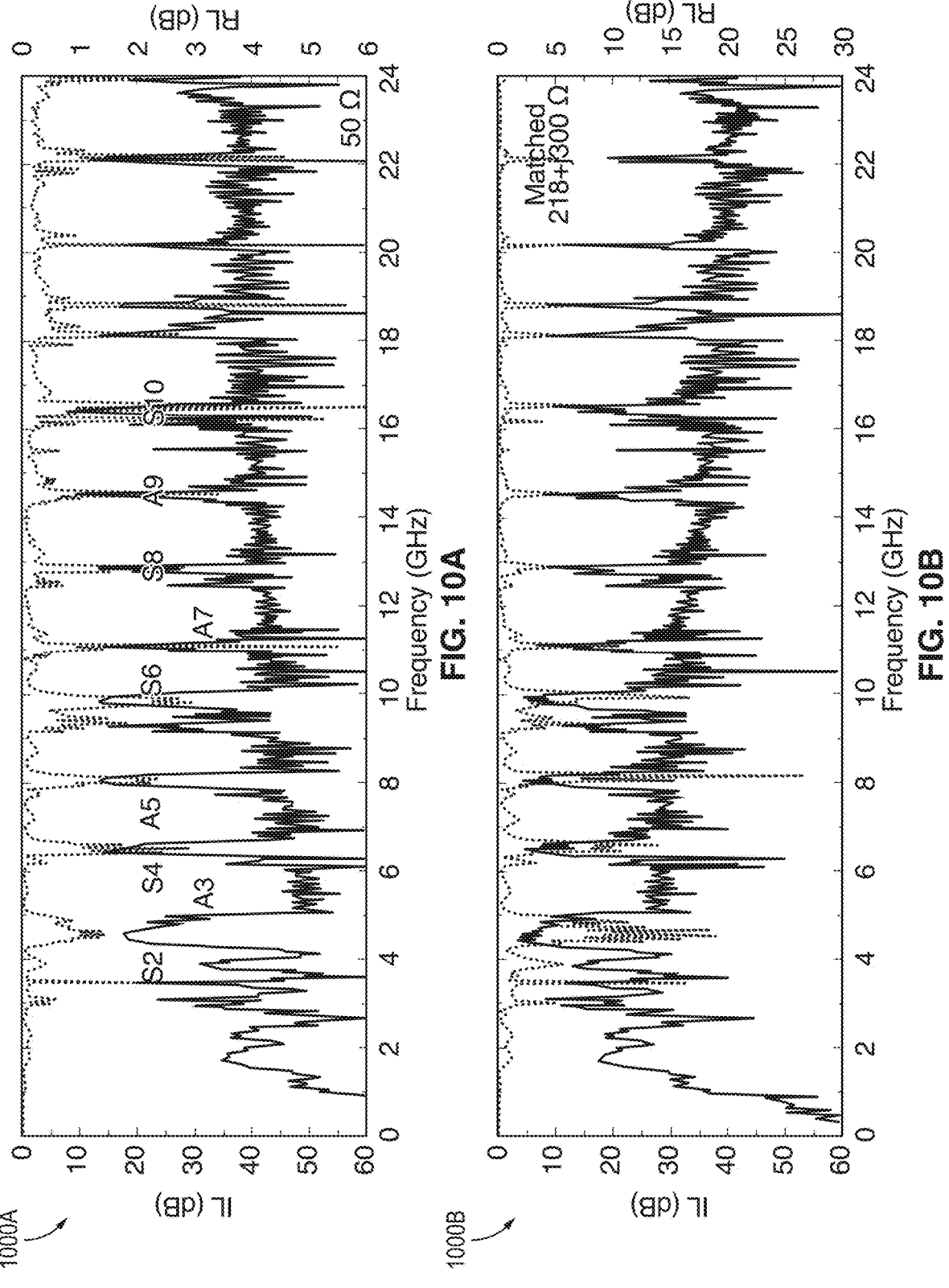
FIGS. 10A-10B are graphs showing simulated insertion loss and return loss results of an acoustic delay line, in accordance with one or more embodiments of the present disclosure.

FIGS. 10A-10B are graphs 1000A and 1000B showing simulated results of an acoustic delay line, in accordance with one or more embodiments of the present disclosure. For example, the acoustic delay line can be the delay line 900 of FIGS. 9A-9B. Graph 1000A shows wideband insertion loss (IL) (dB) and return loss (RL) (dB) plotted between frequencies of 0 GHz to 24 GHz with both ports of the delay line terminated with 50Ω, and graph 1000B shows the IL and RL in which the performance is impedance-matched to 218+j300Ω based on the S2 band, where j is the imaginary unit. 50Ω delay lines can be designed by sizing the transducers and including series inductors.

It is assumed that a feedthrough capacity of 1 fF is included between the ports. The passbands of different higher-order modes are labeled. Pronounced passbands between S2 and S10 can be observed between 4.55 GHz and 16.5 GHz, except A3, whose $K^2$ diminishes. An IL of 17.5 dB and a 3-dB FBW of 6.16% are obtained for the S2 mode at 4.55 GHz. An IL of 14.5 dB and a 3-dB FBW of 1.42% are obtained for the S4 mode at 6.46 GHz. Higher frequency bands (e.g., above A3) that were previously unattainable due to significant mode cut-off are enabled by the complementary multi-layer stack embodiments described herein. Such higher-order modes can have less than 3-dB FBW, which is caused by lower $K^2$ of those higher-order modes. As further shown in graph 1000B, adjacent bands to S2 (e.g., S4, A5 and S6) are also matched due to the lower $K^2$ of the higher-order modes being compensated by a higher operating frequency (f), which leads to similar radiation conductance at different bands.

Additionally, more pronounced ripples can be observed under the conjugate matched case, caused by a reduced IL for the triple transit echo (TTE) from the bi-directional IDTs of the delay line. The ripples can be less severe in actual implementations because of the existence of the acoustic propagation loss (PL). To mitigate the effects of the multi-reflections for benchmarking delay line performance, the average IL and 3-dB FBW can be obtained from the smoothed transmission (e.g., 400-point-window from measured data). An average IL of 5.6 dB and a 3-dB FBW of 9.31% can be obtained for S2 at 4.55 GHz. An average IL of 7.6 dB and a 3-dB FBW of 4.36% can be obtained for S4 at 6.46 GHz. The values are close to the predicted IL of 6 dB, with a slight difference due to the in-band ripples. The key parameters for other bands are listed in Table IV as follows:

TABLE IV

| Mode | 50 Ω | | | Matched to S2 | | |
|------|------|------|------|------|------|------|
| | $f_c$ | IL | FBW | $f_c$ | IL* | FBW |
| S2 | 4.55 GHz | 17.5 dB | 6.16% | 4.55 GHz | 5.6 dB | 9.31% |
| S4 | 6.46 GHz | 14.5 dB | 1.42% | 6.54 GHz | 7.6 dB | 4.36% |
| A5 | 8.06 GHz | 13.4 dB | 1.76% | 8.10 GHz | 7.8 dB | 2.74% |
| S6 | 9.85 GHz | 13.1 dB | 1.81% | 9.91 GHz | 7.5 dB | 2.01% |
| A7 | 11.1 GHz | 13.8 dB | 0.52% | 11.1 GHz | 13.6 dB | 1.24% |
| S8 | 12.9 GHz | 13.2 dB | 0.31% | 12.9 GHz | 13.7 dB | 0.60% |
| A9 | 14.6 GHz | 9.36 dB | 0.19% | 14.6 GHz | 12.0 dB | 0.71% |
| S10 | 16.5 GHz | 7.68 dB | 0.21% | 16.6 GHz | 16.4 dB | 0.49% |

*Average IL for the matched case that has mitigated effects from multi-reflections.

Acoustic delay lines with different gap lengths between IDTs can show a similar IL if the Lamb waveguide is assumed lossless. However, the difference in IL in an actual implementation can be used to extract PL. The frequency spacing between in-band ripples of delay lines with shorter gap lengths can be larger because of a longer resonant cavity between the IDTs for triple transit interference (TTI). Acoustic delay lines with longer gap lengths can have higher group delay, and the difference can be used to extract group velocity, as will now be described in further detail below with reference to FIGS. 11A-11B.

Figures 11A, 11B:
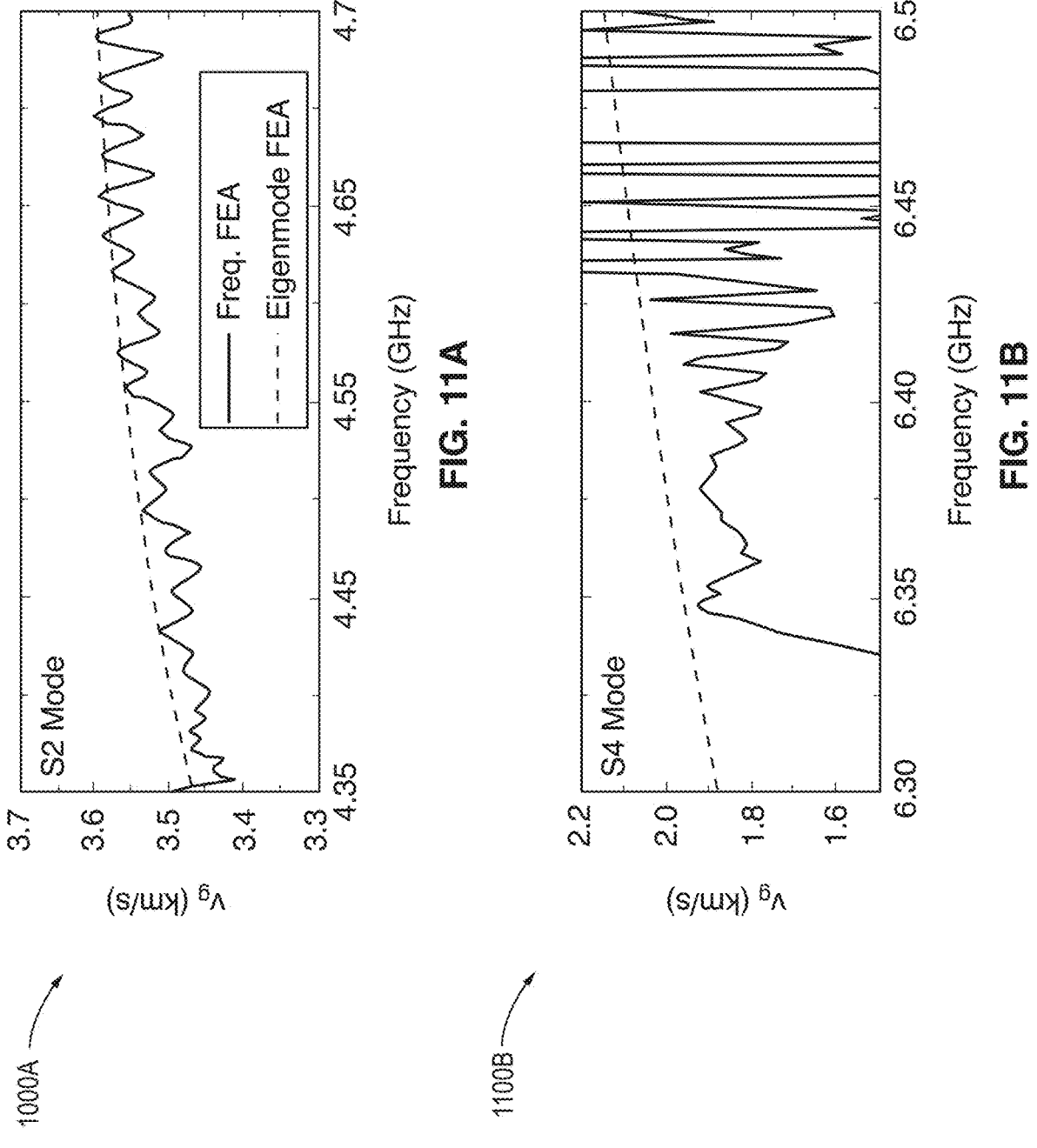
FIG. 11A-11B are graphs showing extracted group velocities, in accordance with one or more embodiments of the present disclosure.

FIG. 11A-11B are graphs 1100A and 1100B showing extracted group velocities, in accordance with one or more embodiments of the present disclosure. More specifically, graph 1100A shows extracted group velocities ($v_g$) (km/s) plotted for the S2 mode between frequencies of 4.35 GHz to 4.75 GHz using both frequency FEA and eigenmode FEA and graph 1100B shows extracted group velocities ($v_g$) (km/s) plotted for the S4 mode between frequencies of 6.30 GHz to 6.50 GHz using both frequency FEA and eigenmode FEA. It is assumed that the group velocities of the S2 and S4 modes shown in graphs 1100A and 1100B, respectively, are extracted using frequency FEA through linear regression. For example, graph 1100A shows a group velocity of about 3.5 km/s for S2 at 4.55 GHz, and graph 1100B shows a group velocity of about 1.8 km/s for S4 at 6.40 GHz. The frequency FEA results agree with the eigenmode FEA results. It is noted that the low coupling resonances between the IDTs in this lossless simulation generate severe ripples, but their effects can be mitigated in actual measurements with PL.

Figures 12A, 12B:
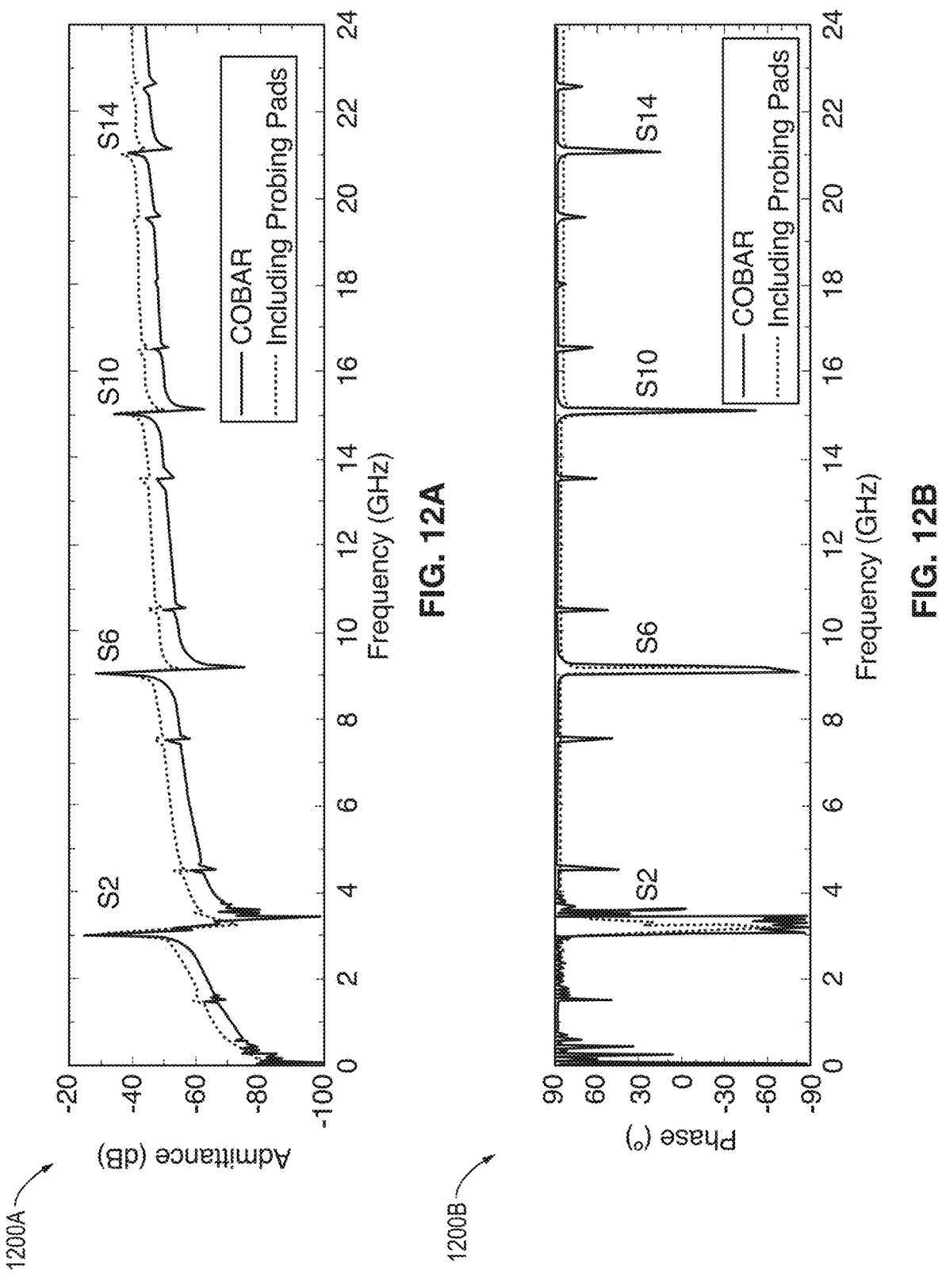
FIGS. 12A-12B are graphs showing measured wideband admittance responses in amplitude and phase for an acoustic resonator and a response excluding the feedthrough from the probing pads, in accordance with one or more embodiments of the present disclosure.
Figures 13A, 13B:
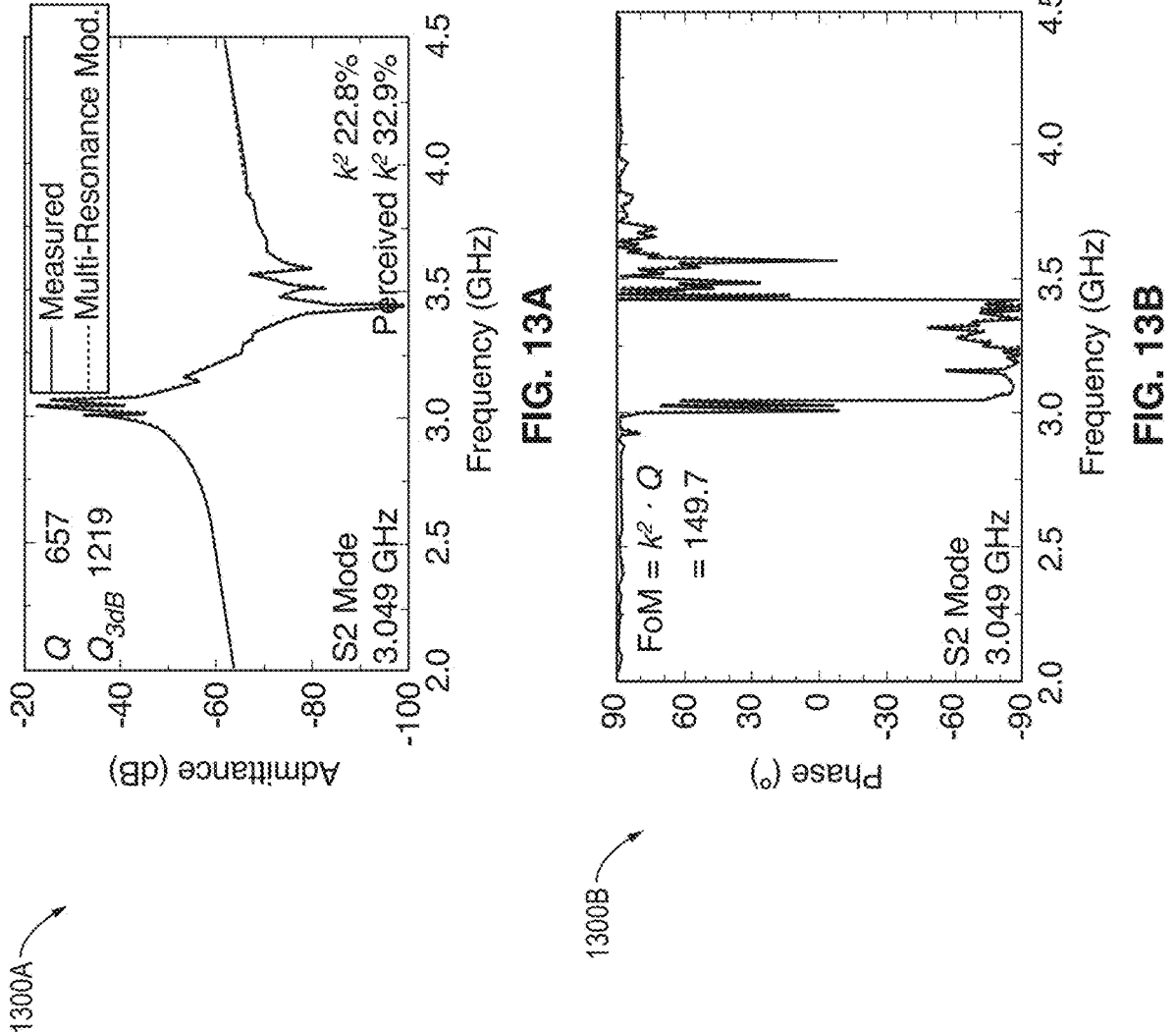
FIGS. 13A-13F are graphs showing zoomed-in measurement and multi-resonance fitted admittance response in amplitude and phase, in accordance with one or more embodiments of the present disclosure.
Figures 13C, 13D:
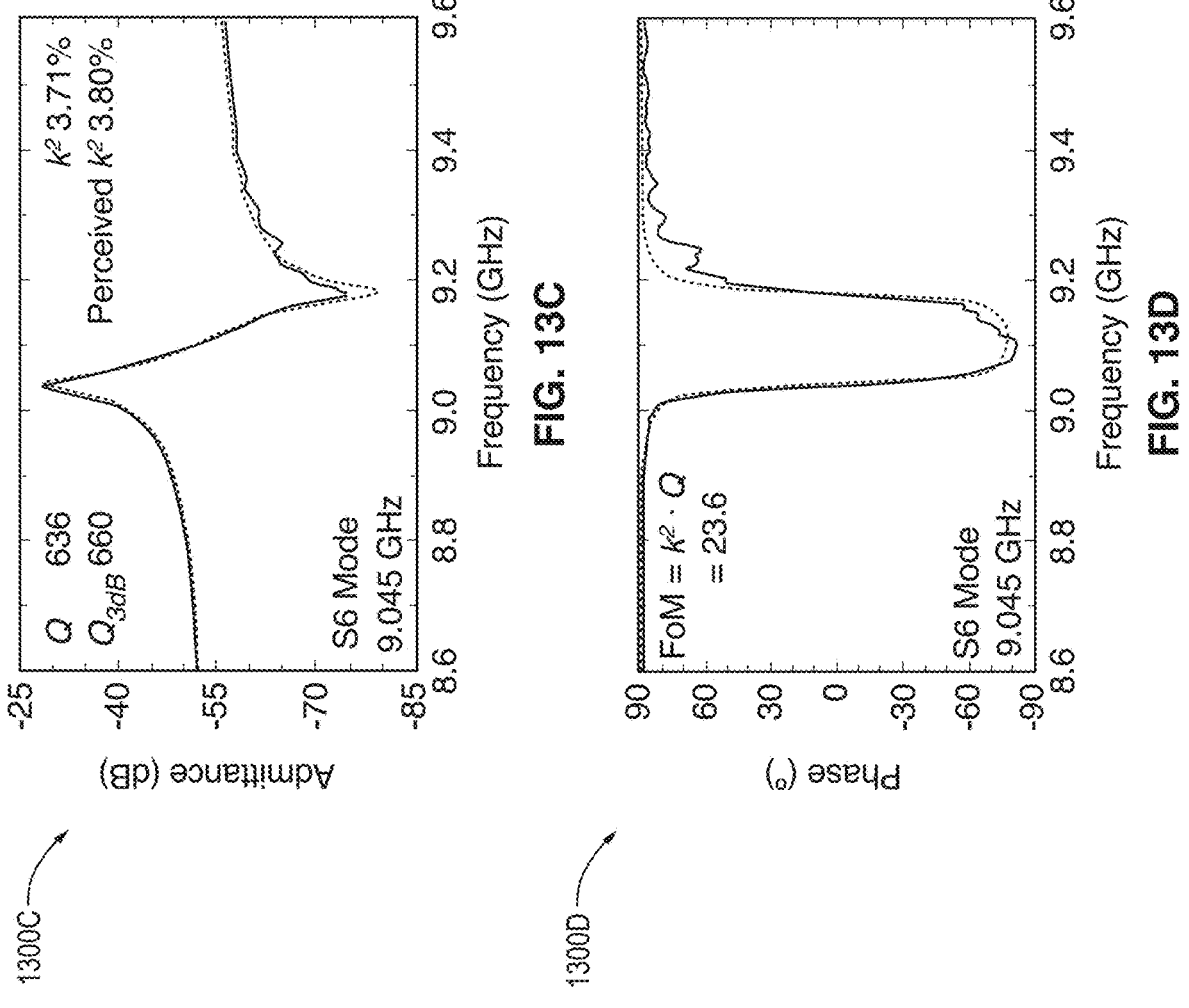
Figures 13E, 13F:
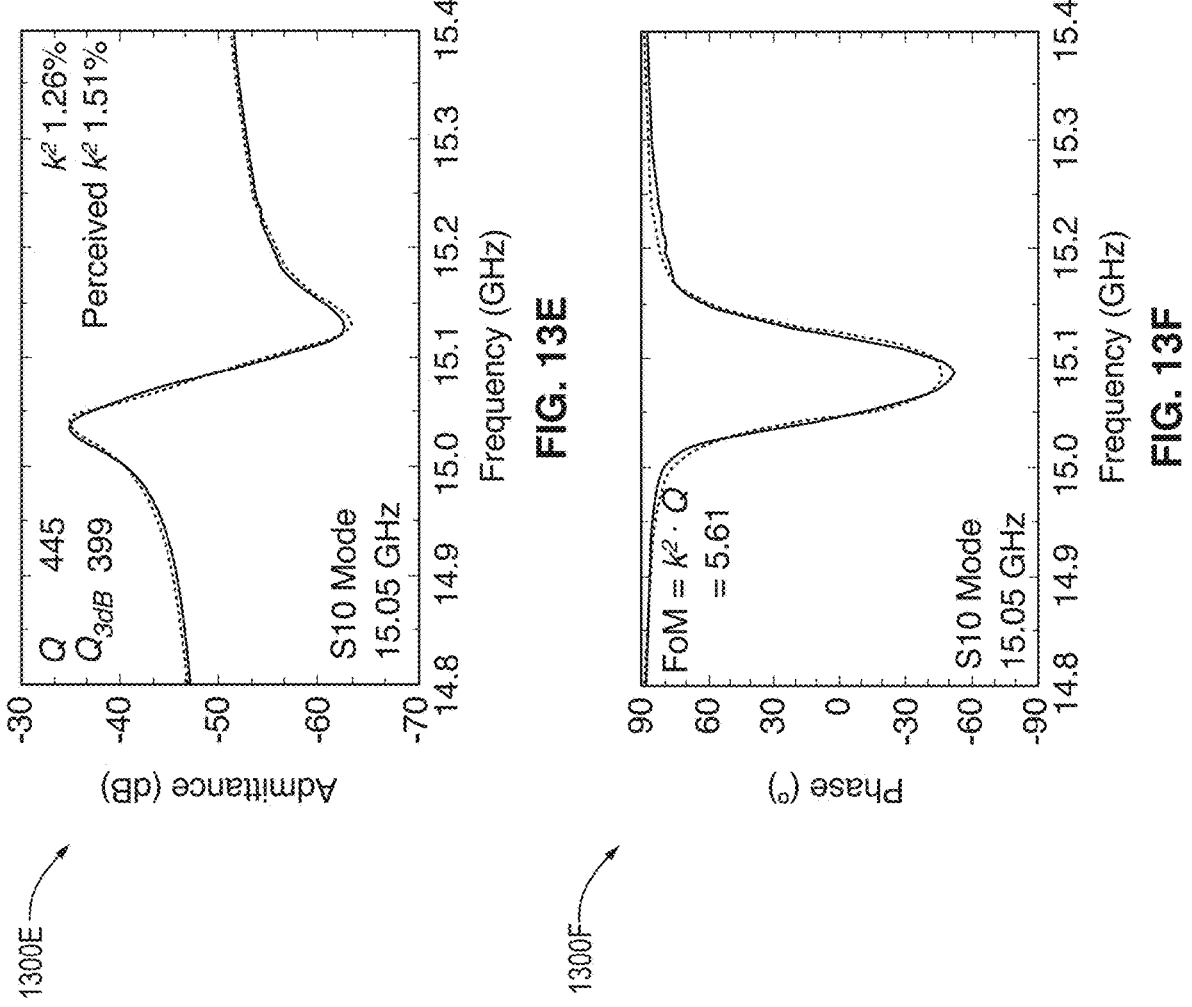

FIGS. 12A-12B are graphs 1200A and 1200B showing measured wideband admittance responses in amplitude and phase for an acoustic resonator and a response excluding the feedthrough from the probing pads, in accordance with one or more embodiments of the present disclosure. In this example, the acoustic resonator is a COBAR, such as the resonator 500 described above with reference to FIGS. 5A-5B. Graph 1200A shows wideband admittance response in amplitude (dB) between frequencies of 0 GHz to 24 GHz and graph 1200B shows wideband admittance response in phase (°) between frequencies of 0 GHz to 24 GHz. The effects of the probing pads can be removed through subtracting the measured feedthrough.

Similar to the simulations described above with reference to FIGS. 6A-6B, a subset of the higher-order modes (e.g., S2, S6, and S10) are effectively excited. However, different from the simulations described above with reference to FIGS. 6A-6B, other higher-order modes are also excited, especially at higher frequencies. This is caused by the slight difference in the thickness of the pair of complementarily-oriented piezoelectric layers of the COBAR, which leads to insufficient cancellation of the mutual energy of these modes. This non-ideality can limit the ultimate operation frequency below 20 GHz, and can be further improved through film trimming. Nevertheless, the examined modes (S2, S6, and S10) show much larger $K^2$ than Lamb modes with other mode orders.

FIGS. 13A-13F are graphs 1300A-1300F showing zoomed-in measurement and multi-resonance fitted admittance response in amplitude and phase, in accordance with one or more embodiments of the present disclosure. Graph 1300A shows wideband admittance response in amplitude (dB) between frequencies of 2 GHz to 4.5 GHz and graph 1300B shows wideband admittance response in phase (°) between frequencies of 2 GHz to 4.5 GHz. More specifically, graphs 1300A and 1300B correspond to the S2 mode. For example, the S2 resonance at 3.049 GHz shows a perceived $K^2$ of 32.9% (Equation 4) and a 3-dB Q of 1219. The extracted $K^2$ is 22.8%, and the extracted Q is 657. These results agree well with the simulated results described above with reference to FIGS. 6A-6B. Similarly, the degradation from the perceived $K^2$ is due at least in part to the existence of the spurious modes (e.g., Modes 2-9 in Table V below). Compared to A1 mode resonators using a single piezoelectric layer above 3 GHz, the S2 mode shown here has an improved Q (above 600) with a similar $K^2$ (above 20%).

Graph 1300C shows wideband admittance response in amplitude (dB) between frequencies of 8.6 GHz to 9.6 GHz and graph 1300D shows wideband admittance response in phase (°) between frequencies of 8.6 GHz to 9.6 GHz. More specifically, graphs 1300C and 1300D correspond to the S6 mode. For example, the S6 resonance at 9.045 GHz shows a perceived $K^2$ of 3.8% (Equation 4) and a 3-dB Q of 660.

The extracted $K^2$ is 3.71%, and the extracted Q is 636 (e.g., mode 13 in Table V below). These results agree well with the simulated results described above with reference to FIGS. 6C-6D.

Graph 1300E shows wideband admittance response in amplitude (dB) between frequencies of 15 GHz to 15.6 GHz and graph 1300F shows wideband admittance response in phase (°) between frequencies of 15 GHz to 15.6 GHz. More specifically, graphs 1300E and 1300F correspond to the S10 mode. For example, the S10 resonance at 15.05 GHz shows a perceived $K^2$ of 1.51% (Equation 4) and a 3-dB Q of 399. The extracted $K^2$ is 1.26%, and the extracted Q is 445 (e.g., mode 16 in Table V below). These results agree with the simulated results described above with reference to FIGS. 6C-6D.

The obtained Q at 9 GHz and obtained Q at 15 GHz are also higher than the reported results using conventional piezoelectric layers (e.g., $LiNbO_3$ thin films). Therefore, the thicker material of the stack of piezoelectric layers not only achieve better frequency scalability but also feature lower loss, likely due to reduced surface losses because of a reduced surface-area-to-volume ratio.

Table V below provides example extracted key parameters from a COBAR simulation, in which the COBAR includes a pair of complementarily-oriented Z-cut single crystal $LiNbO_3$ piezoelectric layers having a total thickness of about 1.2 μm and IDT electrodes made of aluminum:

TABLE V

| Sym. | Value | Sym. | Value | Sym. | Value |
|---|---|---|---|---|---|
| $C_0$ | 34.6 fF | $L_s$ | 0.25 nH | n | 21 |
| $f_{s1}$ | 3.05 GHz | $k_1^2$ | 22.8% | $Q_1$ | 657 |
| $f_{s2}$ | 3.01 GHz | $k_2^2$ | 7.26% | $Q_2$ | 482 |
| $f_{s3}$ | 3.03 GHz | $k_3^2$ | 5.35% | $Q_3$ | 581 |
| $f_{s4}$ | 3.16 GHz | $k_4^2$ | 0.82% | $Q_4$ | 238 |
| $f_{s5}$ | 3.29 GHz | $k_5^2$ | 0.49% | $Q_5$ | 71.4 |
| $f_{s6}$ | 3.33 GHz | $k_6^2$ | 0.14% | $Q_6$ | 231 |
| $f_{s7}$ | 3.49 GHz | $k_7^2$ | 0.13% | $Q_7$ | 186 |
| $f_{s8}$ | 3.56 GHz | $k_8^2$ | 0.31% | $Q_8$ | 214 |
| $f_{s9}$ | 3.68 GHz | $k_9^2$ | 0.14% | $Q_9$ | 65 |
| $f_{s10}$ | 1.51 GHz | $k_{10}^2$ | 0.21% | $Q_{10}$ | 620 |
| $f_{s11}$ | 4.51 GHz | $k_{11}^2$ | 0.15% | $Q_{11}$ | 625 |
| $f_{s12}$ | 7.52 GHz | $k_{12}^2$ | 0.19% | $Q_{12}$ | 537 |
| $f_{s13}$ | 9.04 GHz | $k_{13}^2$ | 3.71% | $Q_{13}$ | 636 |
| $f_{s14}$ | 10.52 GHz | $k_{14}^2$ | 0.18% | $Q_{14}$ | 405 |
| $f_{s15}$ | 13.53 GHz | $k_{15}^2$ | 0.12% | $Q_{15}$ | 398 |
| $f_{s16}$ | 15.05 GHz | $k_{16}^2$ | 1.26% | $Q_{16}$ | 445 |
| $f_{s17}$ | 16.54 GHz | $k_{17}^2$ | 0.15% | $Q_{17}$ | 318 |
| $f_{s18}$ | 19.56 GHz | $k_{18}^2$ | 0.16% | $Q_{18}$ | 239 |
| $f_{s19}$ | 21.05 GHz | $k_{19}^2$ | 0.49% | $Q_{19}$ | 309 |
| $f_{s20}$ | 22.56 GHz | $k_{20}^2$ | 0.13% | $Q_{20}$ | 245 |
| $f_{s21}$ | 24.05 GHz | $k_{21}^2$ | 0.04% | $Q_{21}$ | 285 |

Figure 14:
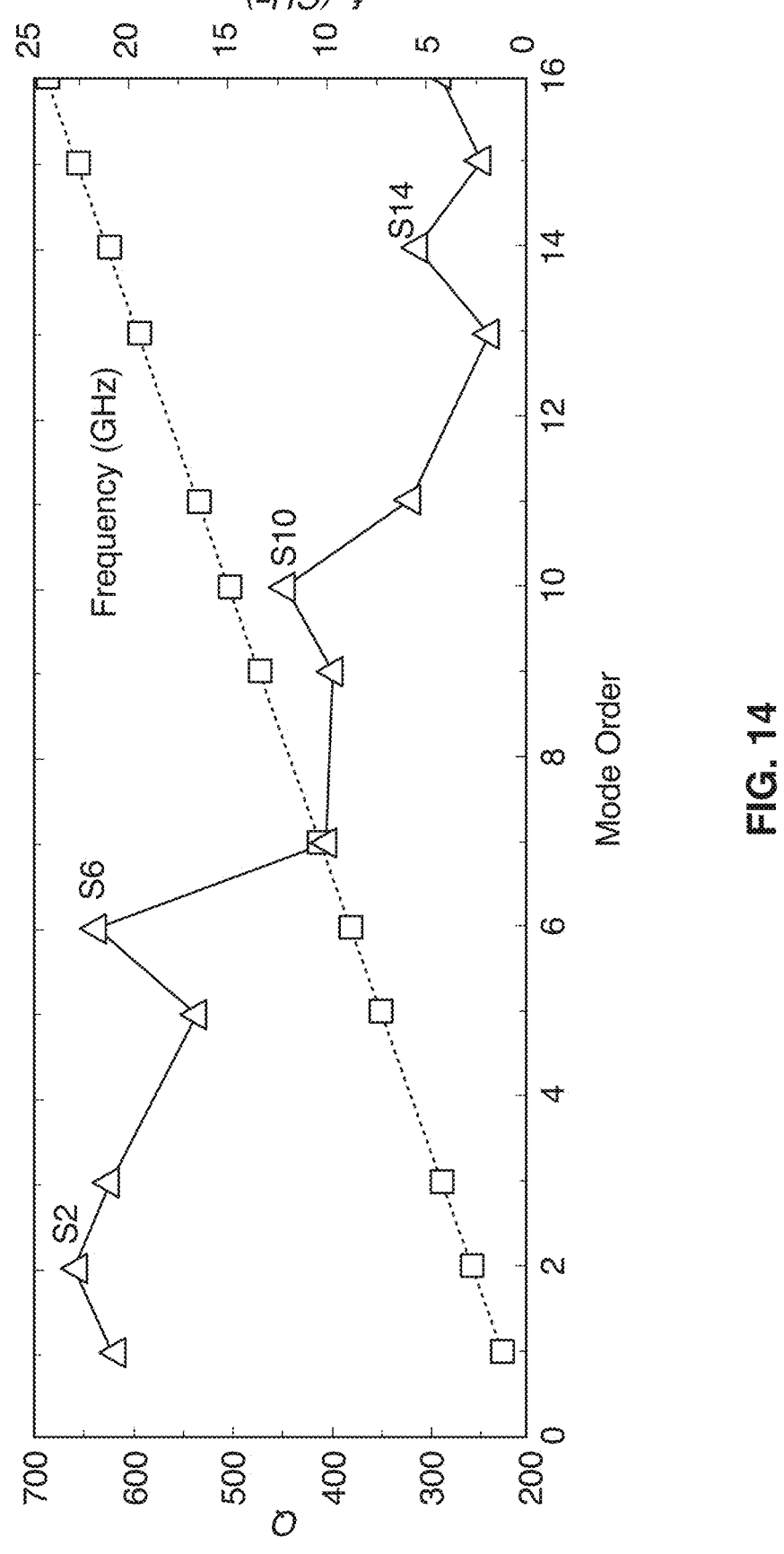
FIG. 14 is a graph showing extracted quality factor and resonance of higher-order modes of Lamb waves in an acoustic resonator, in accordance with one or more embodiments of the present disclosure.

FIG. 14 is a graph 1400 showing extracted quality factor (Q) and resonant frequency ($f_s$) of higher-order modes of Lamb waves in a complementarily-oriented multi-layer acoustic resonator, in accordance with one or more embodiments of the present disclosure. Each triangle shown in graph 1400 represents the Q for a mode (e.g., S2, S6, S10 and S14), and each square shown in graph 1400 represents the $f_s$ corresponding to the mode. As shown, the resonant frequency is linearly proportional to the mode order, with a frequency spacing of 1.503 GHz for adjacent modes. The higher-order modes, within the same resonant body, present a declining Q at higher frequencies, from around 600 below 10 GHz (A1 to S6) to about 200 above 20 GHz (A13 to S16). The result that the higher-order Lamb waves show higher damping might be caused by a combination of more significant electrical and mechanical damping at higher frequencies.

Figures 15A, 15B:
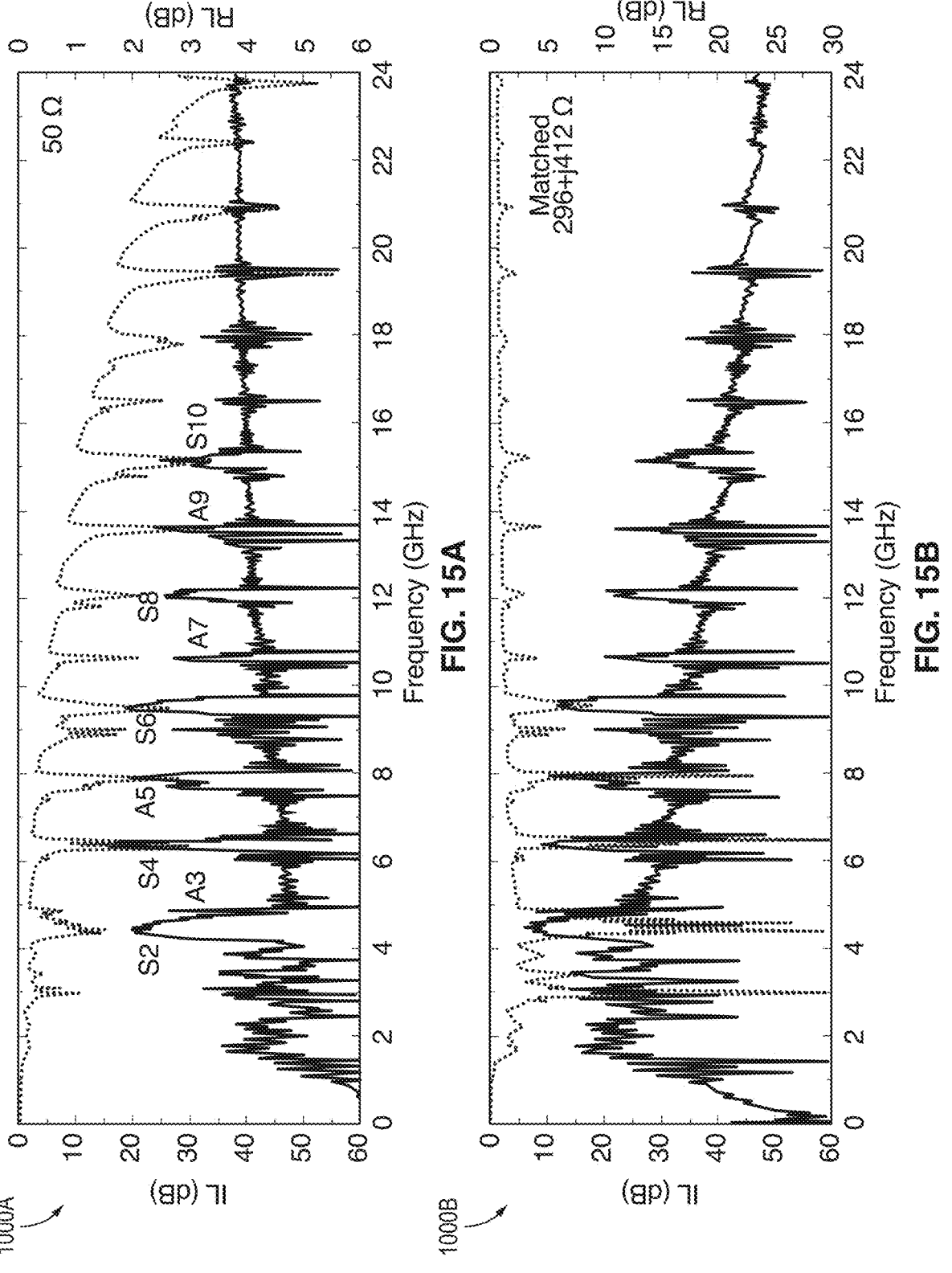
FIGS. 15A-15B are graphs showing measured wideband insertion loss and return loss of an acoustic delay line, in accordance with one or more embodiments of the present disclosure.

FIGS. 15A-15B are graphs 1500A and 1500B showing measured results of an acoustic delay line, in accordance with one or more embodiments of the present disclosure. For example, the acoustic delay line can be the delay line 900 of FIGS. 9A-9B. It is assumed that the acoustic delay line is a COB-ADLs, with the results measured with a network analyzer at the −10 dBm power level in the air.

Graph 1500A shows wideband insertion loss (IL) (dB) and return loss (RL) (dB) plotted between frequencies of 0 GHz to 24 GHz with both ports of the delay line terminated with 50Ω. 50Ω delay lines can be designed by sizing the transducers and including series inductors. The passbands of different higher-order Lamb modes are labeled. Similar to the simulated results shown in FIGS. 10A-10B, pronounced passbands between S2 and S10 can be observed between 4.46 GHz and 15.1 GHz. An IL of 19.7 dB and a 3-dB FBW of 5.08% are obtained for the S2 mode at 4.41 GHz. An IL of 15.7 dB and a 3-dB FBW of 1.28% are obtained for the S4 mode at 6.32 GHz. Higher frequency bands (e.g., above A3) that were previously unattainable due to significant mode cut-off are enabled by the complementary multi-layer stack embodiments described herein. Such higher-order modes can have less than 3-dB FBW, which is caused by lower $K^2$ of those higher-order modes. As further shown in graph 1000B, adjacent bands to S2 (e.g., S4, A5 and S6) are also matched due to the lower $K^2$ of the higher-order modes being compensated by a higher operating frequency ($f_c$), which leads to similar radiation conductance at different bands.

Graph 1500B shows the IL and RL in which the performance is impedance-matched to 296+j412Ω based on the S2 band. To mitigate the effects of the multi-reflections for benchmarking the delay line performance, the average IL and 3-dB FBW are obtained from the smoothed transmission (e.g., 400-point-window from measured data). An average IL of 7.5 dB and a 3-dB FBW of 7.55% can be obtained for S2 at 4.46 GHz. An average IL of 10.3 dB and a 3-dB FBW of 2.03% can be obtained for S4 at 6.36 GHz. These values show that the port impedance mismatch is the main source of IL, and COB-ADLs for larger aperture widths can be designed if a 50Ω device is desired.

Table VI below provides example extracted key parameters from COB-ADL measurements, in which the COB-ADL includes a pair of complementarily-oriented Z-cut single crystal LiNbO₃ piezoelectric layers having a total thickness of about 1.2 μm and IDT electrodes made of aluminum:

TABLE VI

| Mode | 50 Ω | | | Matched to S2 | | |
|------|------|------|------|------|------|------|
| | $f_c$ | IL | FBW | $f_c$ | IL* | FBW |
| S2 | 4.41 GHz | 19.7 dB | 5.08% | 4.46 GHz | 7.5 dB | 7.55% |
| S4 | 6.32 GHz | 15.7 dB | 1.28% | 6.36 GHz | 10.3 dB | 2.03% |
| A5 | 7.88 GHz | 19.1 dB | 0.86% | 7.93 GHz | 11.6 dB | 1.39% |
| S6 | 9.49 GHz | 18.4 dB | 1.41% | 9.56 GHz | 12.8 dB | 2.15% |
| A7 | 10.6 GHz | 26.5 dB | 0.80% | 10.63 GHz | 23.5 dB | 0.96% |
| S8 | 12.0 GHz | 25.4 dB | 0.81% | 12.08 GHz | 24.0 dB | 1.62% |
| A9 | 13.6 GHz | 23.3 dB | 0.47% | 13.58 GHz | 25.2 dB | 0.55% |
| S10 | 15.1 GHz | 37.9 dB | 0.41% | 15.15 GHz | 27.8 dB | 0.82% |

*Average IL for the matched case to mitigate the effects of multi-reflections

Compared to the simulation described above with reference to FIGS. 10A-10B, some differences can be found. For example, an increase in IL, especially for the higher frequency bands, is observed, because of the existence of the PL. This also implies that the PL is higher for higher-order modes. As another example, larger RL is seen at a higher frequency caused by the electrical loading of IDTs. As yet another example, $f_c$ of the higher-order Lamb waves are lower in the measurement because the actual film stack is slightly thicker than the about 1.2 μm total thickness of the bilayer stack, which shifts the dispersion of Lamb waves to lower frequencies. Nevertheless, the LiNbO₃ enables the efficient transduction of higher-order Lamb waves.

Figures 16A, 16B:
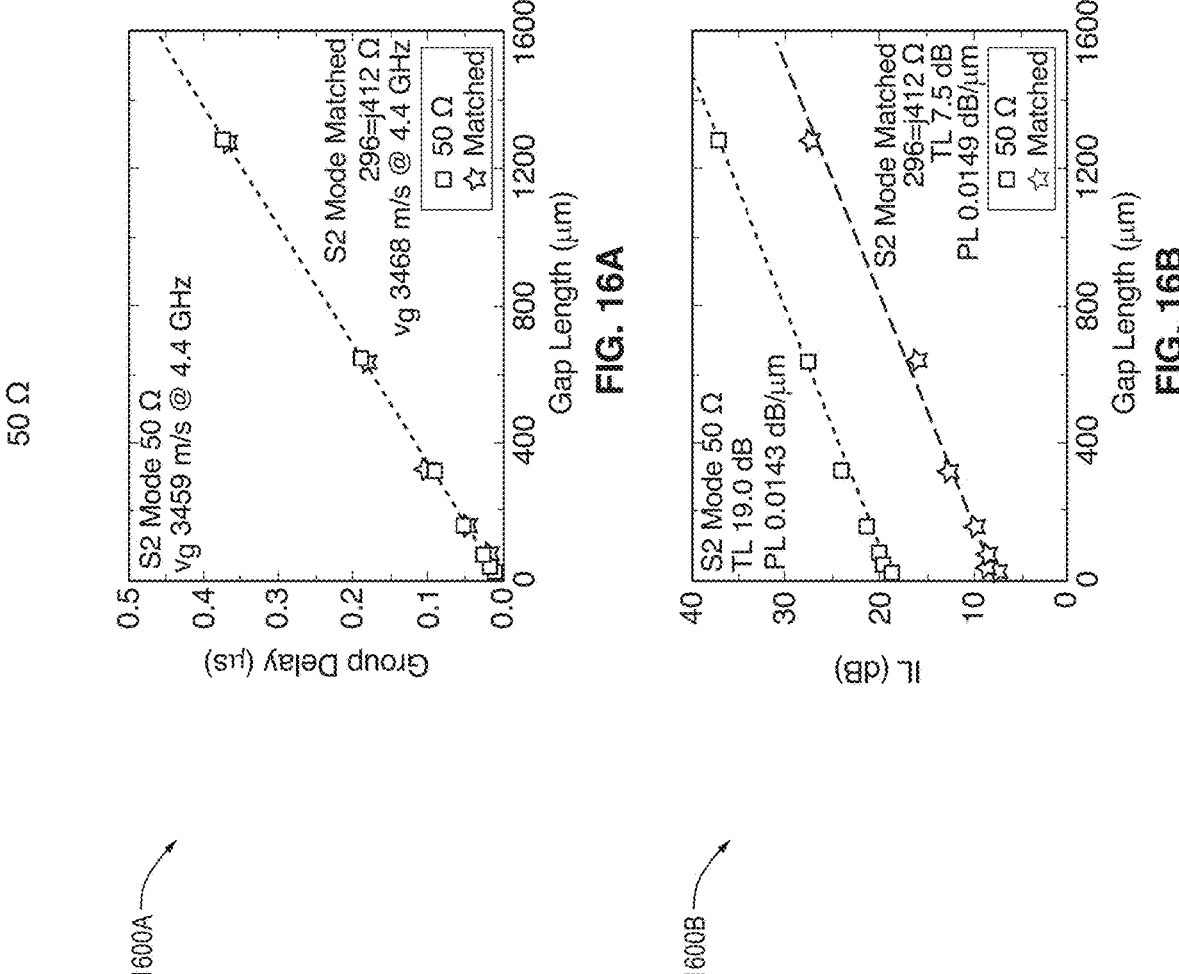
FIGS. 16A-16B are graphs showing propagation parameters plotted for various acoustic delay lines, in accordance with one or more embodiments of the present disclosure.

FIGS. 16A-16B are graphs 1600A and 1600B showing propagation parameters plotted for various acoustic delay lines, in accordance with one or more embodiments of the present disclosure. For example, an acoustic delay line can be the delay line 900 (e.g., COB-ADL) described above with reference to FIGS. 9A-9B. More specifically, graph 1600A shows group delay (μs) of an S2 mode plotted as a function of gap length (m) for both the 50Ω and 296+j412Ω matched cases at a center frequency of 4.4 GHz, and graph 1600B shows IL (dB) of the S2 mode plotted as a function of gap length for both the 50Ω and 296+j412Ω matched cases at the center frequency of 4.4 GHz. The transducer loss (TL) is also obtained, showing a TL of 7.5 dB for the matched case, and a TL of 19.0 dB for the 50Ω case, with the difference caused by the impedance mismatch.

FIGS. 17A-17D are graphs 1700A-1700B showing plots of propagation parameters of various orders of modes of Lamb waves, in accordance with one or more embodiments of the present disclosure. More specifically, graph 1700A shows extracted group velocities ($v_g$) (km/s) plotted for the S2 mode between frequencies of 4.2 GHz to 4.7 GHz obtained by measurements and eigenmode simulation (e.g., FEA), and graph 1700B shows extracted group velocities plotted for the S4 mode between frequencies of 6.30 GHz to 6.50 GHz obtained by measurements and eigenmode simulation. For example, graph 1700A shows a group velocity of about 3.5 km/s for S2 at 4.4 GHz, and graph 1700B shows a group velocity of about 1.8 km/s for S4 at 6.40 GHz.

Graph 1700C shows extracted propagation loss (PL) (dB/μm) measurements plotted for the S2 mode between frequencies of 4.2 GHz to 4.7 GHz, and graph 1700D shows extracted pPL measurements plotted for the S4 mode between frequencies of 6.30 GHz to 6.50 GHz. For example, the S2 band has a PL around 0.015 dB/μm, while the S4 band has a PL approximately 0.020 dB/μm in the passband. The higher PL of Lamb waves with a larger mode order agrees with that obtained in the COBAR case (e.g., as described above with reference to FIGS. 15A-15B).

Figure 18A:
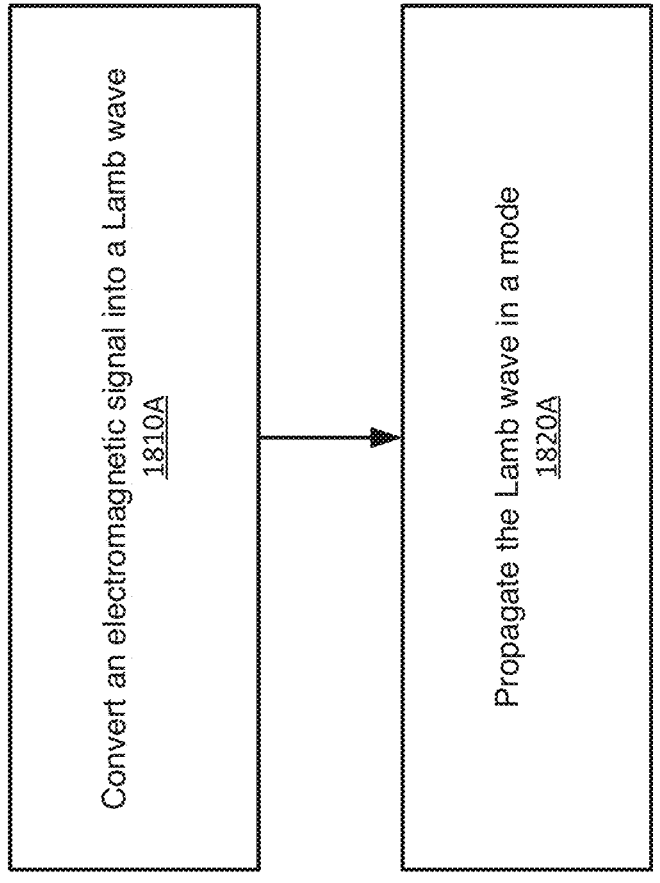
FIGS. 18A-18B are flowcharts of methods for implementing acoustic devices, in accordance with one or more embodiments of the present disclosure.

FIG. 18A shows a flowchart of a method 1800A for implementing an acoustic device, in accordance with one or more embodiments of the present disclosure. For example, the acoustic device can include an acoustic resonator, such as the acoustic resonator 500 of FIGS. 5A-5B.

At operation 1810A, a device converts an electromagnetic signal into a Lamb wave. The device can include a stack of at least two piezoelectric layers, and an interdigitated transducer (IDT) disposed on at least one of a top surface or a bottom surface of the stack. The electromagnetic signal can travel along a length of the stack.

For example, the stack can include a first piezoelectric layer and a second piezoelectric layer disposed on the first piezoelectric layer. The first piezoelectric layer has a first cut plane orientation and the second piezoelectric layer has a second cut plane orientation complementary to the first orientation. In some embodiments, the stack can further include a third piezoelectric layer disposed on the second piezoelectric layer. The third piezoelectric layer can have the first cut plane orientation that is complementary to the second cut plane orientation of the second piezoelectric layer.

In some embodiments, being complementary includes the first cut plane orientation being defined as having a first out-of-plane axis and the second cut plane orientation being defined as having a second out-of-plane axis oriented 180° relative to the first out-of-plane axis. For example, each out-of-plane axis can be a Z-axis of a three-dimensional (3D) Cartesian coordinate system, such as the Z-axis shown in FIGS. 5A-5B.

In some embodiments, being complementary includes the first cut plane orientation being defined as having a first in-plane axis and the second cut plane orientation being defined as having a second in-plane axis oriented 180° relative to the first in-plane axis. For example, each in-plane axis can be an X-axis of the 3D Cartesian coordinate system, such as the X-axis shown in FIGS. 5A-5B. The other in-plane axis (e.g., Y-axis of the 3D Cartesian coordinate system) can have the same cut plane orientation with respect to both the first piezoelectric layer and the second piezoelectric layer.

Each piezoelectric layer of the stack can include an anisotropic material. For example, each piezoelectric layer can include at least one of: lithium niobate ($LiNbO_3$), lithium tantalate ($LiTaO_3$), potassium niobate ($KNbO_3$), potassium tantalate ($KTaO_3$), aluminum nitride (AlN), or aluminum scandium nitride (AlScN). Each piezoelectric layer of the stack can include at least one of: a single-crystal film or a poly-crystal film.

The IDT can include a first set of electrodes connected to a ground bus line and a second set of electrodes connected to a signal bus line and interdigitated with the first set of electrodes. A first electrode of the second set of electrodes can be separated from an adjacent electrode of the first set of electrodes by an electrode gap having a longitudinal distance affecting a resonant frequency.

Each piezoelectric layer of the stack can have a thickness between about 0.05 μm to about 2 μm. Each electrode of the IDT can have an electrode thickness between about 0.03 μm to about 1 μm. The electrode gap can be between about 1 μm to about 25 μm. Each electrode of the IDT can have an electrode width between about 0.3 μm to about 4 μm. The IDT can have a cell length between adjacent electrodes of the second set of electrodes (and/or the first set of electrodes) of between about 10 μm to about 300 μm. The electrode width and the cell length can each be configured to mitigate spurious Lamb modes.

At operation 1820A, the device propagates the Lamb wave in a mode. More specifically, the mode can have an order corresponding to a number of piezoelectric layers of the stack. For example, the mode can have an order greater than or equal to two. The mode can be excited by a lateral electric field generated by the IDT. Further details regarding the method 1800A are described above with reference to FIGS. 1-17.

Figure 18B:
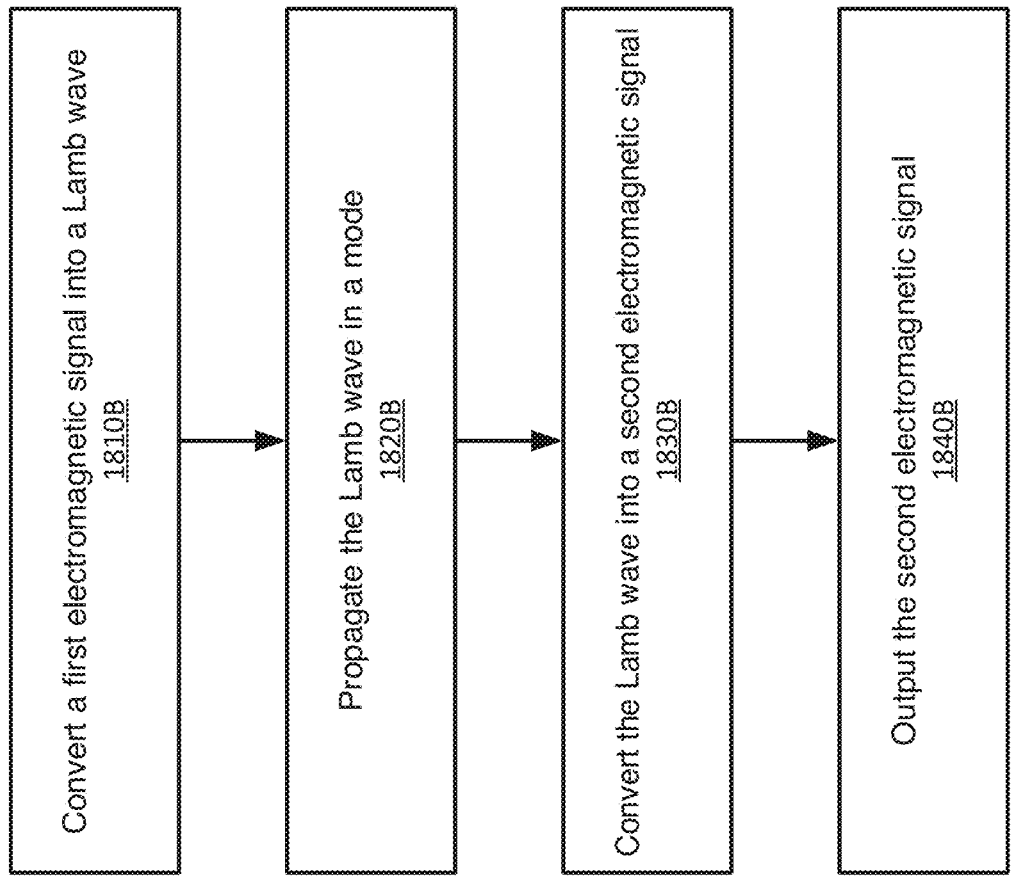

FIG. 18B shows a flowchart of a method 1800B for implementing an acoustic device, in accordance with one or more embodiments of the present disclosure. For example, the acoustic device can include an acoustic delay line, such as the acoustic delay line of FIGS. 9A-9B.

At operation 1810B, a device converts a first electromagnetic signal into a Lamb wave. The device can include a stack of at least two piezoelectric layers, a first interdigitated transducer (IDT) disposed on at least one of a top surface or a bottom surface of the stack at a first end of the stack, and a second IDT disposed on at least one of a top surface or a bottom surface of the stack at a second end of the stack with a gap between the second IDT and the first IDT. For example, the first IDT can convert the first electromagnetic signal into the Lamb wave. The electromagnetic signal can travel along a length of the stack.

For example, the stack can include a first piezoelectric layer and a second piezoelectric layer disposed on the first piezoelectric layer. The first piezoelectric layer has a first cut plane orientation and the second piezoelectric layer has a second cut plane orientation complementary to the first orientation. In some embodiments, the stack can further include a third piezoelectric layer disposed on the second piezoelectric layer. The third piezoelectric layer can have the first cut plane orientation that is complementary to the second cut plane orientation of the second piezoelectric layer.

In some embodiments, being complementary includes the first cut plane orientation being defined as having a first out-of-plane axis and the second cut plane orientation being defined as having a second out-of-plane axis oriented 180° relative to the first out-of-plane axis. For example, each out-of-plane axis can be a Z-axis of a three-dimensional (3D) Cartesian coordinate system, such as the Z-axis shown in FIGS. 9A-9B.

In some embodiments, being complementary includes the first cut plane orientation being defined as having a first in-plane axis and the second cut plane orientation being defined as having a second in-plane axis oriented 180° relative to the first in-plane axis. For example, each in-plane axis can be an X-axis of the 3D Cartesian coordinate system, such as the X-axis shown in FIGS. 9A-9B. The other in-plane axis (e.g., Y-axis of the 3D Cartesian coordinate system) can have the same cut plane orientation with respect to both the first piezoelectric layer and the second piezoelectric layer.

Each piezoelectric layer of the stack can include an anisotropic material. For example, each piezoelectric layer can include at least one of: lithium niobate ($LiNbO_3$), lithium tantalate ($LiTaO_3$), potassium niobate ($KNbO_3$), potassium tantalate ($KTaO_3$), aluminum nitride (AlN), or aluminum scandium nitride (AlScN). Each piezoelectric layer of the stack can include at least one of: a single-crystal film or a poly-crystal film.

The first IDT can include a first set of electrodes connected to a ground bus line and a second set of electrodes connected to a signal bus line and interdigitated with the first set of electrodes. The second IDT can include a third set of electrodes connected to the ground bus line and a second set of electrodes connected to the signal bus line and interdigitated with the third set of electrodes.

Each piezoelectric layer of the stack can have a thickness between about 0.3 m to about 2 μm. Each electrode of the first IDT and the second IDT can have an electrode thickness between about 0.02 μm to about 1 μm. The gap length between the first IDT and the second IDT can be between about 10 μm to about 8000 μm. Each electrode of the first IDT and the second IDT can have an electrode width between about 0.2 μm to about 20 μm The first IDT and the second IDT can have a cell length between adjacent electrodes of the second set of electrodes (and/or the first set of electrodes) of between about 0.4 μm to about m. The electrode width and the cell length are each configured to mitigate a cut-off phenomenon and excite the mode.

At operation 1820B, the device propagates the Lamb wave in a mode. More specifically, the mode can have an order corresponding to a number of piezoelectric layers of the stack. For example, the mode can have an order greater than or equal to two. The mode can be excited by a lateral electric field generated by the IDT.

At operation 1830B, the device converts the Lamb wave into a second electromagnetic signal. For example, the second IDT can convert the Lamb wave into the second electromagnetic signal after a time delay affected by a gap length of the gap between the first IDT and the second IDT.

At operation 1840B, the device outputs the second electromagnetic signal. In some embodiments, the device includes a waveguide inside of which is disposed the stack, the first IDT, and the second IDT, a first port, coupled to the first IDT, to receive the first electromagnetic signal, and a second port, coupled to the second IDT, to output the second electromagnetic signal. Further details regarding the method 1800B are described above with reference to FIGS. 1-17.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An acoustic resonator comprising:
a stack of at least two piezoelectric layers configured to propagate a Lamb wave in a mode having an order corresponding to a number of piezoelectric layers of the stack, the stack comprising:
a first piezoelectric layer formed from a first Z-cut material, and a second piezoelectric layer formed from a second Z-cut material and disposed on the first piezoelectric layer, wherein the first piezoelectric layer has a first cut plane orientation, and wherein the second piezoelectric layer has a second cut plane orientation that is complementary to the first cut plane orientation; and
an interdigitated transducer (IDT) disposed on at least one of a top surface of the stack or a bottom surface of the stack, wherein the IDT comprises a first set of electrodes connected to a ground bus line and a second set of electrodes connected to a signal bus line and interdigitated with the first set of electrodes, wherein a first electrode of the second set of electrodes is separated from an adjacent electrode of the first set of electrodes by an electrode gap having a longitudinal distance affecting a resonant frequency;
wherein:
each electrode of the IDT has an electrode width between about 0.3 micrometer (µm) to about 4 µm;
the IDT has a cell length between adjacent electrodes of the second set of electrodes of between about 10 µm to about 300 µm; and
the electrode width and the cell length are each configured to mitigate spurious Lamb modes.

2. The acoustic resonator of claim 1, wherein the stack further comprises a third piezoelectric layer formed from a third Z-cut material and disposed on the second piezoelectric layer, and wherein the third piezoelectric layer has the first cut plane orientation that is complementary to the second cut plane orientation of the second piezoelectric layer.

3. The acoustic resonator of claim 1, wherein each piezoelectric layer of the stack comprises an anisotropic material comprising at least one of: lithium niobate ($LiNbO_3$), lithium tantalate ($LiTaO_3$), potassium niobate ($KNbO_3$), potassium tantalate ($KTaO_3$), aluminum nitride (AlN), or aluminum scandium nitride (AlScN).

4. The acoustic resonator of claim 1, wherein each piezoelectric layer of the stack comprises one of: a single-crystal film or a poly-crystal film.

5. The acoustic resonator of claim 1, wherein being complementary comprises the first cut plane orientation being defined as having a first out-of-plane axis and the second cut plane orientation being defined as having a second out-of-plane axis oriented 180° relative to the first out-of-plane axis.

6. The acoustic resonator of claim 1, wherein being complementary comprises the first cut plane orientation being defined as having a first in-plane axis and the second cut plane orientation being defined as having a second in-plane axis oriented 180° relative to the first in-plane axis.

7. The acoustic resonator of claim 1, wherein:
each piezoelectric layer of the stack has a thickness between about 0.05 µm to about 2 µm;
each electrode of the IDT has an electrode thickness between about 0.03 µm to about 1 µm; and
the electrode gap is between about 1 µm to about 25 µm.

8. An acoustic delay line comprising:
a stack of at least two piezoelectric layers configured to propagate a Lamb wave in a mode having an order corresponding to a number of piezoelectric layers of the stack, wherein the stack comprises a first piezoelectric layer formed from a first Z-cut material, and a second piezoelectric layer formed from a second Z-cut material and disposed on the first piezoelectric layer, wherein the first piezoelectric layer has a first cut plane orientation, and wherein the second piezoelectric layer has a second cut plane orientation that is complementary to the first cut plane orientation;
a first interdigitated transducer (IDT) disposed on at least one of a top surface of the stack or a bottom surface of the stack at a first end of the stack and configured to convert, into the Lamb wave, a first electromagnetic signal traveling along a length of the stack, wherein the first IDT comprises a first set of electrodes connected to a ground bus line and a second set of electrodes connected to a signal bus line and interdigitated with the first set of electrodes; and a second IDT disposed on the at least one of the top surface or the bottom surface at a second end of the stack with a gap between the second IDT and the first IDT, the second IDT being configured to convert the Lamb wave into a second electromagnetic signal after a time delay affected by a gap length of the gap, wherein the second IDT comprises a third set of electrodes connected to the ground bus line and a fourth electrode connected to the signal bus line and interdigitated with the third set of electrodes;

wherein:

each electrode of the first IDT has an electrode width between about 0.2 micrometer (μm) to about 20 μm;

the first IDT has an associated cell length between adjacent electrodes of the second set of electrodes of between about 0.4 μm to about 40 μm; and the electrode width and the associated cell length are each configured to mitigate a cut-off phenomenon and excite the mode.

9. The acoustic delay line of claim 8, wherein the stack further comprises a third piezoelectric layer formed from a third Z-cut material and disposed on the second piezoelectric layer, and wherein the third piezoelectric layer has the first cut plane orientation that is complementary to the second cut plane orientation of the second piezoelectric layer.

10. The acoustic delay line of claim 8, wherein each piezoelectric layer of the stack comprises an anisotropic material comprising at least one of: lithium niobate ($LiNbO_3$), lithium tantalate ($LiTaO_3$), potassium niobate ($KNbO_3$), potassium tantalate ($KTaO_3$), aluminum nitride (AlN), or aluminum scandium nitride (AlScN).

11. The acoustic delay line of claim 8, wherein each piezoelectric layer of the stack comprises one of: a single-crystal film or a poly-crystal film.

12. The acoustic delay line of claim 8, wherein being complementary comprises the first cut plane orientation being defined as having a first out-of-plane axis and the second cut plane orientation being defined as having a second out-of-plane axis oriented 180° relative to the first out-of-plane axis.

13. The acoustic delay line of claim 8, wherein being complementary comprises the first cut plane orientation being defined as having a first in-plane axis and the second cut plane orientation being defined as having a second in-plane axis oriented 180° relative to the first in-plane axis.

14. The acoustic delay line of claim 8, further comprising:

a waveguide inside of which is disposed the stack, the first IDT, and the second IDT;

a first port, coupled to the first IDT, to receive the first electromagnetic signal; and a second port, coupled to the second IDT, to output the second electromagnetic signal.

15. The acoustic delay line of claim 8, wherein:

each piezoelectric layer of the stack has a thickness between about 0.3 μm to about 2 μm;

each electrode of the first IDT has an electrode thickness between about 0.02 μm to about 1 μm; and the gap length is between about 10 μm to about 8000 μm.

16. A method comprising:

converting, by a device comprising an interdigitated transducer (IDT) disposed on at least one of a top surface or a bottom surface of a stack of at least three piezoelectric layers, into a Lamb wave, an electromagnetic signal traveling along a length of the stack, wherein the stack comprises a first piezoelectric layer formed from a first Z-cut material, and a second piezoelectric layer formed from a second Z-cut material and disposed on the first piezoelectric layer, wherein the first piezoelectric layer has a first cut plane orientation, and wherein the second piezoelectric layer has a second cut plane orientation complementary to the first cut plane orientation; and propagating, by the device, the Lamb wave in a mode having an order corresponding to a number of piezoelectric layers of the stack, wherein the mode is excited by a lateral electric field generated by the IDT;

wherein the IDT comprises a first set of electrodes connected to a ground bus line and a second set of electrodes connected to a signal bus line and interdigitated with the first set of electrodes, wherein a first electrode of the second set of electrodes is separated from an adjacent electrode of the first set of electrodes by an electrode gap having a longitudinal distance affecting a resonant frequency;

wherein:

each electrode of the IDT has an electrode width between about 0.3 micrometer (μm) to about 4 μm;

the IDT has a cell length between adjacent electrodes of the second set of electrodes of between about 10 μm to about 300 μm; and the electrode width and the cell length are each configured to mitigate spurious Lamb modes.

17. The method of claim 16, wherein the IDT is disposed on a first end of the stack, and wherein the method further comprises:

converting, by a second IDT disposed on the at least one of the top surface or the bottom surface of the stack at a second end of the stack, the Lamb wave into a second electromagnetic signal after a time delay determined by a gap between the IDT and the second IDT; and outputting the second electromagnetic signal.

18. The method of claim 16, wherein the stack further comprises a third piezoelectric layer formed from a third Z-cut material and disposed on the second piezoelectric layer, and wherein the third piezoelectric layer has the first cut plane orientation that is complementary to the second cut plane orientation of the second piezoelectric layer.

19. The method of claim 16, wherein each piezoelectric layer of the stack comprises an anisotropic material comprising at least one of: lithium niobate ($LiNbO_3$), lithium tantalate ($LiTaO_3$), potassium niobate ($KNbO_3$), potassium tantalate ($KTaO_3$), aluminum nitride (AlN), or aluminum scandium nitride (AlScN).

20. The method of claim 16, wherein being complementary comprises the first cut plane orientation being defined as having a first out-of-plane axis and the second cut plane orientation being defined as having a second out-of-plane axis oriented 180° relative to the first out-of-plane axis.

21. The method of claim 16, wherein being complementary comprises the first cut plane orientation being defined as having a first in-plane axis and the second cut plane orientation being defined as having a second in-plane axis oriented 180° relative to the first in-plane axis.

* * * * *